United States Patent [19]
Miyata et al.

[11] Patent Number: 6,084,239
[45] Date of Patent: *Jul. 4, 2000

[54] ELECTRON MICROSCOPE

[75] Inventors: Tomoyuki Miyata, Mitaka; Atsushi Katayama, Kokubunji; Daiji Tsuboi, Kodaira; Hiroyuki Kobayashi, Mito; Hisashi Sato, Hitachinaka; Hiroyuki Kuriyama, Tokyo, all of Japan; Peter Hohmann, Kirchseeon, Germany

[73] Assignee: Hitachi, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/097,708

[22] Filed: Jun. 16, 1998

Related U.S. Application Data

[62] Division of application No. 08/715,378, Sep. 12, 1996, Pat. No. 5,864,138.

[30] Foreign Application Priority Data

| Sep. 14, 1995 | [JP] | Japan | ................................ 7-236955 |
| Sep. 14, 1995 | [JP] | Japan | ................................ 7-236970 |

[51] Int. Cl.⁷ .................................................. G01N 23/00

[52] U.S. Cl. ...................... 250/440.11; 250/311; 250/310

[58] Field of Search ............................... 250/440.11, 311, 250/310

[56] References Cited

U.S. PATENT DOCUMENTS

| 3,814,356 | 6/1974 | Coleman et al. | ........................ 248/18 |
| 3,835,320 | 9/1974 | Helwig | .................................. 250/311 |
| 3,873,831 | 3/1975 | Ruska et al. | ........................... 250/306 |
| 4,044,256 | 8/1977 | Krisch et al. | .......................... 250/311 |
| 4,523,094 | 6/1985 | Rossow | ................................. 250/311 |
| 5,350,921 | 9/1994 | Aoyama et al. | ....................... 250/311 |

FOREIGN PATENT DOCUMENTS 56-3962 11/1981 Japan .

OTHER PUBLICATIONS

Hitachi Electron Microscope H–7000 Catalog.

P.A. Stoyanov et al, EMV–100L electron microscope, Instruments and Experimental Techniques, No. 1, Jan. 1970, pp. 245–247.

"Jeol Electron Optics and Analytical Instrumentation", Jeol Co., Ltd. Tokyo, Japan.

*Primary Examiner*—Teresa M. Arroyo
*Assistant Examiner*—Nikita Wells
*Attorney, Agent, or Firm*—Beall Law Offices

[57] ABSTRACT

The electron microscope provides sufficient leg space for an observer sitting in a chair in a working posture and allows concentrated observation and swift operation of the electron microscope without burdening the observer. An electron gun column is supported on a support structure formed in a rectangular parallelepiped. The electron gun column, a column evacuation device and a viewing chamber are mounted on the dampers on the support structure through a vibration plate. The table is mounted on the support structure through table supports provided on the top surface of the support structure. Further, the table has an opening at a location corresponding to the viewing chamber so that the table and the viewing chamber, both mounted on the support structure, are not in contact with each other. The layout of the operation panel divides the operation devices of the electron microscope into a group of devices that are frequently reached by touch and operated during observation and a group of devices that are not frequently used during observation. The former group is arranged in arc areas within reach of the operator's arms when pivoted about the elbows as the operator rests his arms naturally on the operation table. The latter group is classified according to the functions performed and is arranged in positions that are behind the arc areas of pivoting arms and are easily recognized visually.

29 Claims, 16 Drawing Sheets

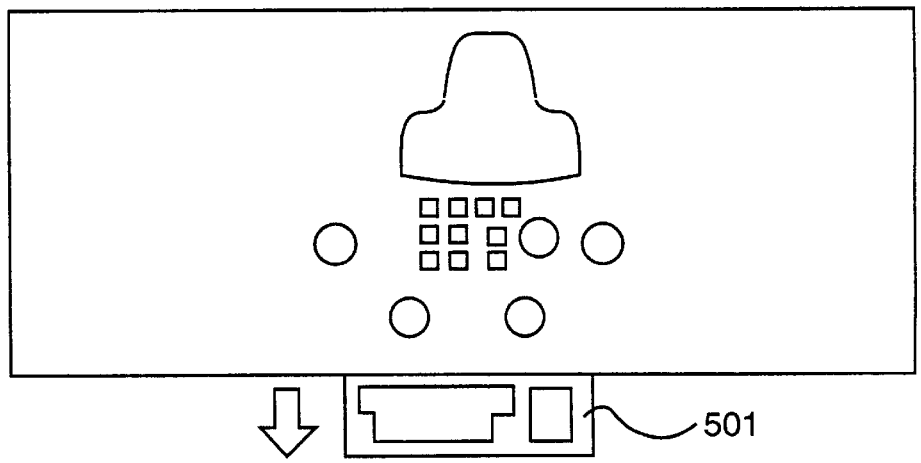
FIG. 26
 
FIG. 27 (a)   FIG. 27 (b)

ELECTRON MICROSCOPE

This application is a divisional of Ser. No. 08/715,378 filed Sep. 12, 1996 U.S. Pat. No. 5,864,138.

FIELD OF THE INVENTION

The present invention relates to an electron microscope and more particularly to an electron microscope having an operational environment that provides for good operational posture of a human operator. In this regard, an easy-to-view display of operation results is achieved by an efficient, concentrated arrangement of display data.

The present invention further relates to an electron microscope that has a variety of operation devices arranged in a layout that permits an operator to easily view and operate the devices.

BACKGROUND OF THE INVENTION

Conventional electron microscopes, such as transmission electron microscopes, generally comprise three structures, i.e., two side structures supporting a display unit and an operation panel and one main structure provided between the side structures. The main structure supports an electron gun column having a viewing chamber, a camera chamber, and an evacuation device installed at the back of the electron gun column when viewed with respect to the view presented to a human observer. These three structures are integrally constructed by placing a table on top of them. The table is mounted to structures supporting the operation panels and slightly extends out toward the observer, with the left and right ends and the back formed almost flush with the structures.

The side structures supporting the operation panel have a specified depth and incorporate control circuit boards, devices associated with electrical, evacuation and cooling systems, and a cut film desiccator. The main structure supporting the electron gun column has a depth smaller than that of the side structures so that when an observer looks into a viewing window, a space is formed below the table at the observer's feet.

The side structures are directed toward the observer and the main structure supporting the electron gun column is arranged parallel to the observer. The table mounted on the side structures is set back at the electron gun column according to the arrangement of the structures, and curves concavely. The display unit and operation panel are located at the rear part of the structures, the farthest position from the observer.

As described above, the conventional electron microscopes have structures that are arranged to allow a human observer easy access to the viewing chamber.

Conventional technologies associated with the electron microscopes of this kind are disclosed, for instance, in Japan Registered Design Publication No. 563962 and in Hitachi Electron Microscope H-7000 catalog.

Further, conventional electron microscopes have many operation devices, such as dials and switches for realizing intended functions, which are scattered across the operation panel and also on the electron gun column, as well as the front of the operation table and the peripheral devices, as shown in the aforementioned prior art publications.

SUMMARY OF THE INVENTION

The table of the prior art Hitachi electron microscope described above is provided between the side structures supporting the operation panel and the main structure supporting the electron gun column, with an open space formed below the table mounted on the main structure to accommodate the observer's legs. Because the side structures supporting the operation panel have a large depth, when an observer puts his feet in the space, the side structures are close to the sides of the observer's feet. When the observer leaves the electron microscope, he must move backwards almost perpendicularly from the main structure supporting the electron gun column. If not, the observer's feet may easily strike the side structures supporting the operation panel, vibrating the electron gun column, resulting in a specimen under observation being moved.

Another problem occurring during observation with the prior art electron microscopes is that when an observer moves his or her legs sideways, the legs or knees contact the side structures, vibrating the electron gun column and moving the specimen being observed. The observer therefore is restricted in his observation posture and feels pain and fatigue during long hours of observation.

Although in the prior art, the display unit and the operation panel are orderly arranged around the electron gun column, the display unit and the operation panel are often located at the rear part of the side structures or distributed to the left or right over a wide area on the table. This results in an arrangement that represents a typical case of the lack of consideration for the user. When a short person, for example, tries to reach an operation button located at the rear part of the side structures while looking into the viewing chamber, he cannot reach it and therefore must interrupt his observation or raise his upper body, making concentrated and swift observation difficult.

Further, the prior art arrangements have the viewing chamber and the display unit spaced apart from each other, so that when the observer takes a look at the display unit, he or she must turn his or her eyes away from the viewing chamber to look at the display unit. In addition, it is not easy for the observer, after looking at the display unit, to find the image that was being observed. Moreover, because the cut film desiccator for drying spare films is positioned in a location remote from the camera chamber, the observer must change his or her posture to replace the film. Replacing the film in a short time therefore is difficult.

Furthermore, because the prior art arrangement has the table mounted on three independent structures, moving the electron microscope requires all three of the structures to be held firmly together or disassembled and moved one structure at a time, consuming substantial labor and time. In addition, with the prior art electron microscopes, the operation panel and the display unit rise like a wall at the rear part of the table, giving the observer a feeling of being oppressed and impairing the appearance of the overall device.

It is an object of the invention to solve the aforementioned drawbacks experienced with the prior art and to provide an ergonomic electron microscope that provides a good operation environment which offers sufficient leg space for an observer sitting in a chair, allows the observer to take a posture conforming to his body's shape while performing operations, and thereby permits concentrated observation and swift operation without burdening the observer.

The above object of this invention can be achieved by an electron microscope, which comprises an electron gun column; a column evacuation device mounted at the back of the electron gun column; a viewing chamber; an operation panel for performing necessary operations for observation; a table; and a support structure; wherein the support structure is formed almost in a rectangular parallelepiped and has dampers and a table support on the top surface thereof, with the dampers arranged on the inner side; wherein the electron gun column, the column evacuation device and the viewing chamber are supported on the support structure through a plate and the dampers, the plate being mounted on the dampers; wherein the table is supported on the support structure through the table support provided on the top surface of the support structure; wherein the table is formed with an opening at a location corresponding to the viewing chamber so that the table and the viewing chamber, both supported on the support structure, do not contact each other.

The above object is also achieved by arranging the table support above a damper support in such a way as to expose the dampers mounted on the damper support, and by arranging the support structure in such a way that the support structure has projecting portions at the top and bottom on both sides thereof when viewed from an observer side and also has a recessed portion between the projecting portions. Further, the width of the top surface of the support structure on which the electron gun column is mounted is made slightly larger than the lateral width of the electron gun column.

The above object is achieved by installing electrical components in the support structure on both sides, by arranging heat generating devices, which need to be cooled, in the support structure and in the column evacuation device, and by concentrating cooling piping at the back of the support structure and the column evacuation device.

The above object is also achieved by curving the edge of the table on the observer's side and the opposite edge in curved lines preferably forming parts of concentric circles having their center at the observer. Also, where the observer's elbows rest, the table edge is inclined upwardly or rounded in an arc from the front toward the rear. The underside of the table near the edge on the observer's side is provided with an illuminating device. Further, a camera chamber is provided below the table at the center with its cover surface formed flat, and a cut film desiccator or film dry box (plate reserver assembly) is provided adjacent to and at a height equivalent to the camera chamber.

The above object is also achieved by movably mounting on the table an operation panel, which has an X-Y stage dial, a focus dial, a brightness adjust dial, a magnification adjust dial, a beam correction and lens correction adjust dial, a photographing switch, and a selector switch for setting the beam correction and lens correction settings. These dials and switches form a minimum required input means for observation, and by arranging the dials in the order of the frequency that they are used in order from the viewing chamber side and outwardly therefrom, starting with the most frequently used ones to the least frequently used one along an arc defined by an arm pivoting about the elbow, which rests on the front side of the table.

The above object is also achieved by locating an observation state indicator, which indicates the condition of magnification, the vacuum levels of the electron gun column, specimen chamber and camera chamber, and mapping data, all of this information being necessary for observation, at a position close to the viewing chamber and facing the observer. Further, a display device, which displays preliminary information that is not required at all times during observation, such as electron gun output conditions, lens output conditions, evacuation system control information and photograph exposure conditions, is supported on the top surface of the support structure at the rear by the side of the viewing chamber through a support fitting which has a movable arm with a base.

With the above-mentioned configuration, there is sufficient leg space provided below the table around the support structure for an observer sitting in a chair in a working posture. The observer need not take a restricted posture during the operation of the device, and thus unwanted vibrations to the electron gun column can be prevented as a result of the observer inadvertently hitting the underneath structures. Further, the observer can place the operation panel wherever he or she wants it to be according to his or her physical shape, so that operation can be performed easily and necessary information can be accessed without the need for substantial body movement by the observer.

Generally, to observe a specimen with an electron microscope requires complicated, delicate operations using various operation devices that are difficult to manipulate except for persons who have acquired operation techniques through extensive training. Further, the operator needs to use the utmost caution while performing the tasks involved in the observation. The aforementioned conventional arrangement presents a problem, therefore, because the devices required to perform the operation are arranged scattered over a wide area, making it difficult to perform the observation operations while looking at the observation screen.

With the advances in the automation of electron microscopes in recent years, the number of devices to be operated is decreasing. Because remote control has become possible, the operation devices can now be arranged at desired locations. This makes it possible to change the layout of the operation devices, which has conventionally been determined according to the requirements of the equipment itself. Thus, it is possible to provide an arrangement of the observation controlling devices, according to the present invention, that permits easy operation of the devices during observation.

The present invention has been accomplished under the above circumstances, and its objective is to provide an electron microscope that solves the above-mentioned conventional problems and which has a layout of the operation panel that conforms to the work pattern of an operator so that various operation devices can be manipulated easily by the operator who is also an observer.

In an electron microscope having an observation chamber or observation indicator, an operation table, and an operation section for performing operations required for observation, the above objects of this invention are achieved by dividing a plurality of the operation devices making up the operation section into a group of devices that are frequently felt with the hand for operation by feel during observation and into a group of devices that are used before or after observation and thus not frequently used during observation. Further, the devices that are frequently located and operated by feel during observation are arranged in areas on the operation table that are within reach of the front arms of the operator when he or she rests his or her arms naturally on the operation table and moves them about their elbows.

To described in more detail, the devices that are frequently felt by hand and used during observation include those for moving the stages and adjusting the focal distance, magnification and brightness. These devices are arranged in areas on the operation table that can be reached by the front arms pivoted about the elbows when the operator puts his or her arms naturally on the table. The devices that are not frequently used include those for making adjustments of power supply, evacuation system, lenses and electron gun.

These devices are classified according to functions and located on the far side from the operator in areas other than those within the natural reach of the front arms of the operator.

In the electronic microscope of this invention, with the upper part of the operator body kept inclined forwardly and with the front arms rested on the operation table during the observation so that he or she can easily watch the observation area, the operator's front arms can be guided over the devices used for observation as the operator pivots the front arms about the elbows. This enables the operator to quickly and accurately feel for the desired operation devices and operate them without looking away from the viewing area.

Further, because the devices that are not intended to be adjusted while making observation are classified according to their function and arranged at easily recognizable positions, they can easily be identified by slightly moving his or her line of sight from the viewing area. Hence, erroneous operation can be prevented.

BRIEF DESCRIPTION OF THE DRAWINGS

FIG. 26 is a plan view showing an example layout of the operation panel of the transmission electron microscope according to the ninth embodiment of this invention.

FIGS. 27(a) and 27(b) are illustrations showing the postures of an operator when he is making observations and when he is making keyboard inputs.

DETAILED DESCRIPTION OF THE PREFERRED EMBODIMENTS

A first embodiment of the electron microscope according to the invention is described by referring to FIGS. 1–14.

Figure 1:
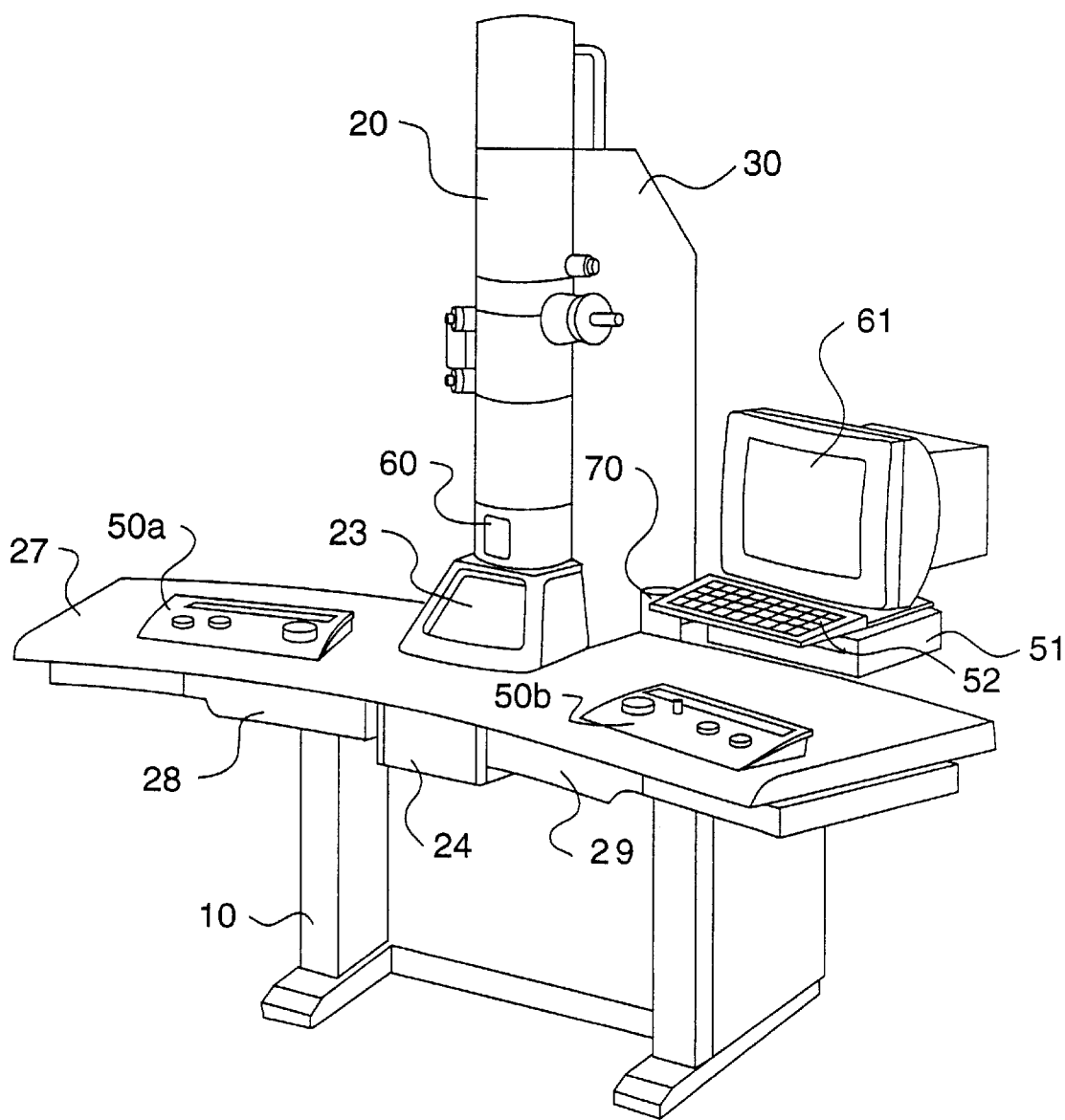
FIG. 1 is a perspective view showing an external view of the transmission electron microscope according to one embodiment of the invention.
Figure 2:
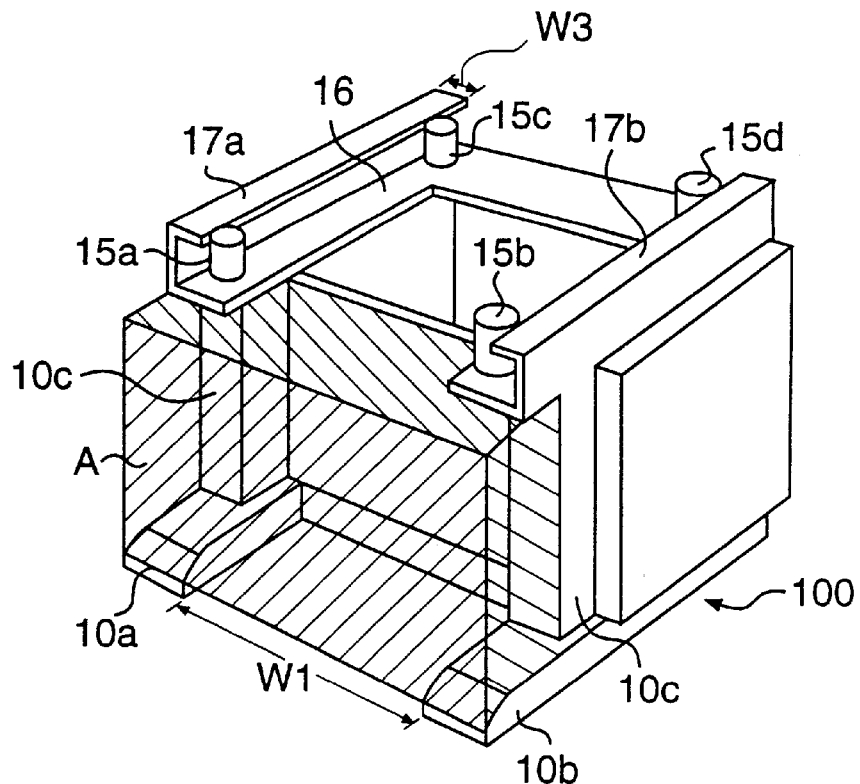
FIG. 2 is a perspective view showing the construction of the support structure.

FIG. 1 is a perspective view showing a transmission electron microscope and FIG. 2 is a perspective view showing the construction of a support structure. First, the rough arrangement of this embodiment is explained as follows. FIG. 1 shows a support structure 100, an electron gun column 20, a viewing chamber 23, a camera chamber 24, a table 27, a cut film desiccator 28, a printed circuit board chamber 29, a column evacuation device 30, operation panels 50a and 50b, a controller 51, a keyboard 52, an observation state indicator 60, and a display 61. In the following description, the side of the electron microscope having the viewing chamber is referred to as the front side; the side opposite the front side is referred to as the back side; the side to the right of the front is referred to as the right-hand side; the side to the left of the front is referred to as the left-hand side; and the side immediately above the viewing chamber is referred to as the top side.

The transmission electron microscope according to the first embodiment of this invention includes, as shown in FIG. 1, a table 27 mounted on the support structure 100 and an electron gun column 20 supported on the support structure 100. The electron gun column 20 incorporates a goniometer stage not shown, a viewing chamber 23, an observation state indicator 60 and a column evacuation device 30.

Below the viewing chamber 23 is provided a camera chamber 24 that is linked with the viewing chamber 23. On the underside of the table 27 facing the floor where the support structure 100 is removed, there are provided a cut film desiccator 28 at the front left of the support structure 100 and a printed circuit board chamber 29 at the front right thereof. Operation panels 50a, 50b are arranged on both sides of the electron gun column 20 on the table 27 so that they are movable independently of each other. The operation panels 50a, 50b are connected through a cord to a control printed circuit board installed in the printed circuit board chamber 29. The cord is long enough to allow free movement of the operation panels 50a, 50b over the table 27.

Near the column evacuation device 30, which is mounted on the top of the back of the support structure 100, there is a support fitting 70 that has an arm with a base which can be moved vertically and back and forth. A keyboard 52 and a display 61 are mounted on the base of the support fitting 70 so that they are located at the top rear side of the support structure and by the side of the viewing chamber. Further, a controller 51 is mounted independently on the support structure 100 below the base of the support fitting 70. The controller 51, keyboard 52 and display 61 combine to form a display unit, which displays preliminary information that is not required to be displayed at all times during observation, such as electron gun output conditions, lens output conditions, evacuation system control information and photograph exposure conditions.

The cut film desiccator 28 for drying spare films is located adjacent to the camera chamber 24 below the table 27. This arrangement minimizes the time that the film is exposed to the air when the observer replaces the used film in the camera chamber 24 with a new film in the cut film desiccator 28, thereby allowing the film to be replaced almost without being oxidized. The cut film desiccator 28 has a drawer formed integrally with a sliding cover, in which films are stored. Hence, simply by pulling the drawer a heavy film can easily be picked up and transferred into the camera chamber 24 quickly.

The transmission electron microscope of this embodiment is connected to peripheral equipment (not shown) such as a high pressure generator, a power supply unit, a hydraulic rotation unit and an air compressor.

FIG. 2 shows the construction of the support structure 100, which is a rectangular parallelepiped with a part of the top surface open. At the top left and top right of the support structure are arranged members that extend almost the same distance as the depth of the support structure 100 and are folded inwardly along their length, like a letter U in cross section, with their lower side width w2 set greater than their upper side width w3. The lower side portions are formed as a damper support 16 and the upper side portions as table supports 17a, 17b. The damper support 16 extends over the top rear part of the support structure 100 to connect together the left and right parts of the damper support 16. Dampers 15a–15d are arranged exposed at four corners of the damper support 16 that together form the damping support system for the electron gun column.

The dampers 15a–15d support the electron gun column 20 of the microscope and the table supports 17a, 17b support the table 27. As described later, the electron gun column 20 and the table 27 are independently supported so that they do not contact each other.

The support structure 100 is not limited to the construction described above and need only have damper support 16 at four corners of the top of the support structure 100. The damper support 16 may be provided at two sides or four sides of the support structure 100. In the above support structure 100 although the damper support 16 has been described to have the same dimension as the sides of the support structure 100, it may be formed as members with short sides located at four corners of the support structure 100 to mount the dampers.

While the table supports 17a, 17b have been shown to be disposed above the damper support 16 and formed of members narrower in width than the damper support 16, the table supports 17a, 17b are not necessarily disposed directly above the damper support 16 or formed of members of the same length as the damper support 16 because the dampers 15a–15d need only be exposed to be able to support the electron gun column 20. If, for example, the table supports 17a, 17b are formed of members having the same width as the damper support 16, their length need only be such as will expose the dampers 15a–15d located at four corners of the damper support 16.

Although, in the above support structure 100, the damper support 16 and the table supports 17a, 17b have been described as being formed into members whose cross section is U-shaped, they may take any other form as long as the surface of the damper support 16 on which the dampers 15a–15d are mounted is horizontal parallel to the floor and the surface of the table supports 17a, 17b in contact with the table 27 is horizontal parallel to the floor. The top of the support structure 100 need not necessarily be open.

Leg portions 10a, 10b at the bottom left and bottom right of the support structure 100 and the damper support 16 and table supports 17a, 17b at the top of the structure all slightly protrude forwardly with respect to the vertical supports of the support structure 100. The front sides of these portions facing the observer are recessed. The width w1 of the recessed portion is set to 836 mm, for instance. This dimension w1 need only be set so that a sufficient leg space can be secured for an operator in a working posture while sitting, even while sitting in an executive chair. This dimension is generally set at 800–1600 mm for securing the leg space A that stretches forward and to the left and right, which is indicated by the cross hatching in FIG. 2. The provision of this leg'space prevents the legs of an operator from abutting against the support structure 100 and ensures that the observer can work comfortably, protecting the electron gun column 20 from vibrations that would otherwise be caused by the legs hitting the structure. When the width w1 of the recessed portion is set to about 1600 mm, two observers can work comfortably.

Figure 3B:
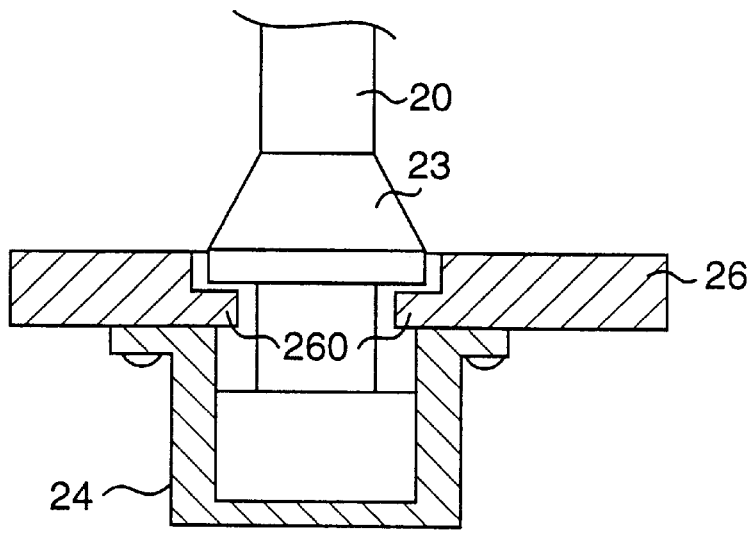
FIG. 3(b) is a partial detail view of the support structure and the electron gun.
Figure 3A:
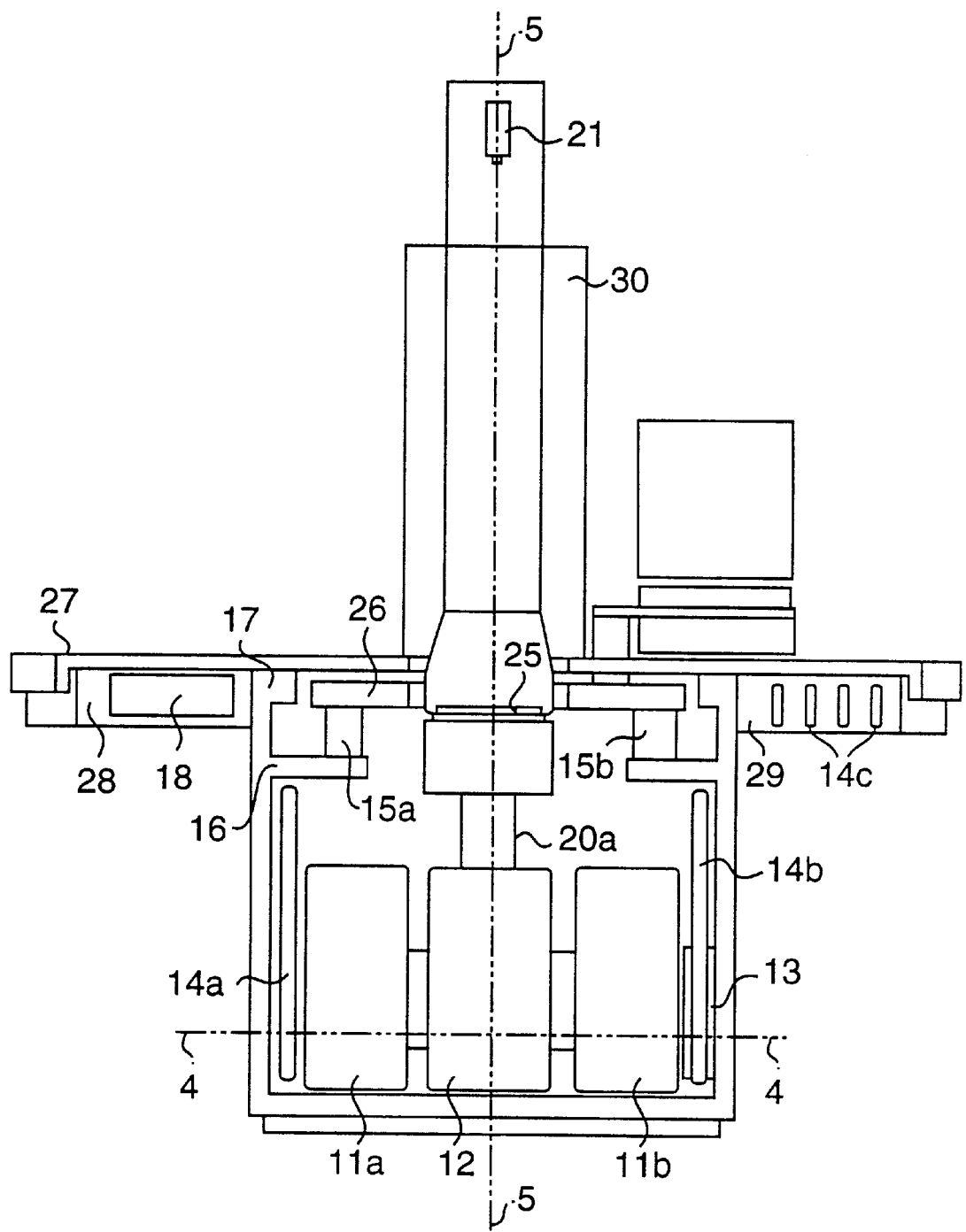
FIG. 3(a) is a front view showing the positional relation between the support structure and the electron gun column of the transmission electron microscope of the embodiment.

FIG. 3(a) is a front view of one embodiment of the transmission electron microscope according to this invention, showing the arrangement of the support structure 100 and the electron gun column 20. In FIG. 3(a), reference numerals 11a, 11b represent buffer tanks, 120 a vacuum pump, 13 a power unit, 14a, 14b main printed circuit boards, 14c a printed circuit board, 18 a cut film desiccator or film dry box (plate reserver assembly) for film, 21 an electron gun, and 26 a plate.

As shown in FIG. 3(a), a plate 26 is mounted on the dampers 15a–15d, which are mounted on the damper support 16 on the top of the support structure 100, in such a way as to cover the opening of the support structure 100. The electron gun column 20 including the column evacuation device 30 is mounted on the upper surface of the plate 26 and is supported on the support structure 100 through the plate 26 and the dampers 15a–15d. As described later, the electron gun column 20 incorporating an electron gun 21 and arranged on the observer's side of the column evacuation device 30 and the viewing chamber 23 having a phosphor plate 25 and arranged at the bottom of the electron gun column 20 are both located at the recessed portion of the support structure 100. The table 27 has an opening at a location corresponding to the electron gun column 20 and the viewing chamber 23, and is supported on the support structure 100 through a table support 17. Hence, the table 27, the electron gun column 20 and the viewing chamber 23 can be kept out of contact with one another although they are supported on the same support structure 100.

Incorporated in the support structure 100 are buffer tanks 11a, 11b and a vacuum pump 120. Also in the support structure 100, a main printed circuit board 14b and a power unit 13 are installed on the right-hand side, and a main printed circuit board 14a is arranged on the left-hand side. The vacuum pump 120 and the electron gun column 20 are connected through a flexible pipe 20a so that vibrations of the vacuum pump 120 can be prevented from propagating to the electron gun column 20.

As shown in FIG. 3(b), and as described above according to this embodiment of the electron microscope, the electron gun column 20, which is most sensitive to vibrations, can be supported directly on the support structure 100 through engagement with a flange 260 recessed in the surface of the plate 26, according to a preferred embodiment. Since the plate 26 is supported by the dampers 15a–15d, the electron gun column is therefore protected against vibrations from the floor and sides of the support structure 100. Further, because the table 27, though directly supported on the support structure 100, has no part directly in contact with the electron gun column 20 and viewing chamber 23, the vibrations from the table 27 generated during observation work can be eliminated by the dampers 15a–15d when they are transmitted to the dampers. Further, the electron gun column 20 is supported at near its center of gravity through the dampers 15a–15d and this arrangement improves the vibration suppression effect on the electron gun column 20.

Figure 4:
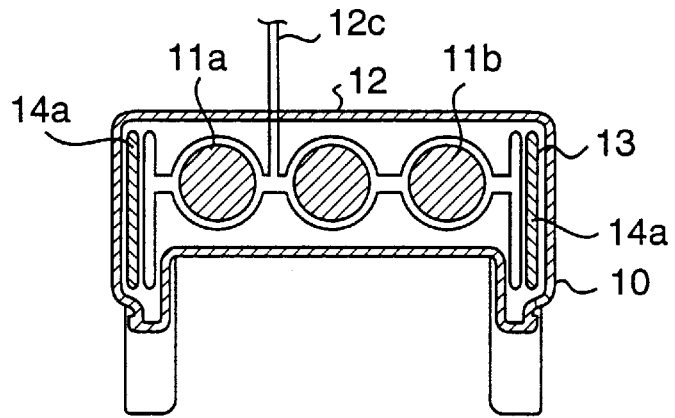
FIG. 4 is a cross section taken along the line 3—3 of FIG. 3(a).
Figure 5:
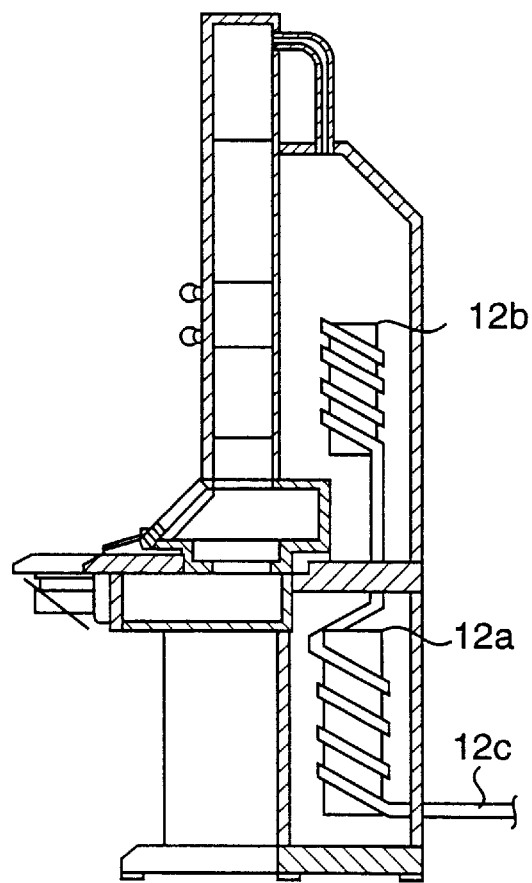
FIG. 5 is a cross section taken along the line 4—4 of FIG. 3(a).

FIG. 4 is a cross section taken along the line 4—4 of FIG. 3(a), and FIG. 5 is a cross section taken along the line 5—5 of FIG. 3(a). Next, by referring to these figures, the internal construction of one embodiment of this invention is described.

As shown in FIGS. 4 and 5 and as described above, the support structure 100 incorporates the buffer tanks 11a, 11b and the vacuum pump 120. The vacuum pump 120 consists of two vacuum pumps 12a, 12b, with the vacuum pump 12a installed inside the support structure 100 along with gate electrodes formed on main printed circuit boards 14a, 14b and power unit 13 arranged at the left and right side, and with the vacuum pump 12b installed inside the column evacuation device 30. The devices installed in the support structure 100 and column evacuation device 30 are cooled by cooling piping 12c coming in from the back.

Because in this embodiment the main printed circuit boards 14a and 14b and the power unit 13 are disposed in a concentrated arrangement at one location together with other heat generating devices such as the buffer tanks 11a, 11b and the vacuum pumps 12a, 12b, these devices can be cooled with a minimum distance of piping, which aids in the cooling efficiency. In the operating condition, the heat generating portion can be located farthest from the observer, so he or she is not influenced by the heat that is generated. Further, this arrangement allows inspection and repair on the devices to be performed from the back and side of the support structure 100.

Because this embodiment supports the electron gun column 20, the minimum required device for observation, inside the projection area of the support structure 100 and because the support fitting 70 for mounting the display 61 is supported on the electron gun column 20, the transmission electron microscope can be moved simply by lifting the support structure 100, alleviating the labor required to install and move the electron microscope.

Figure 6:
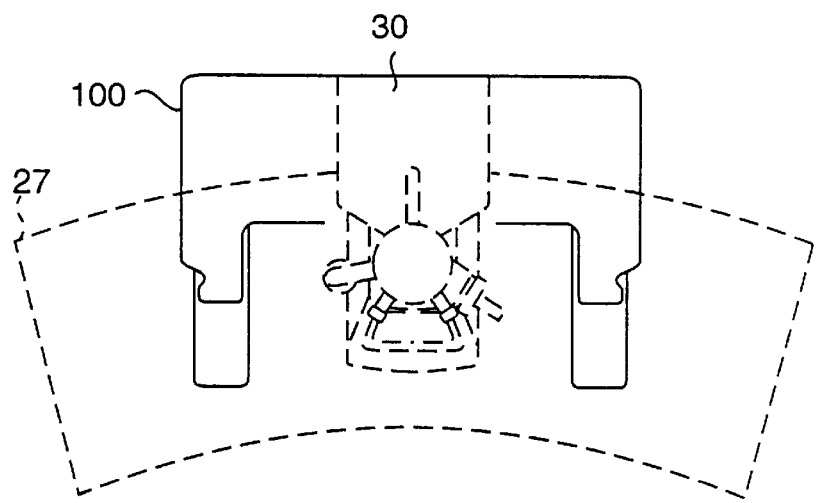
FIG. 6 is a plan view showing the positional relation between the support structure and the table.
Figure 7:
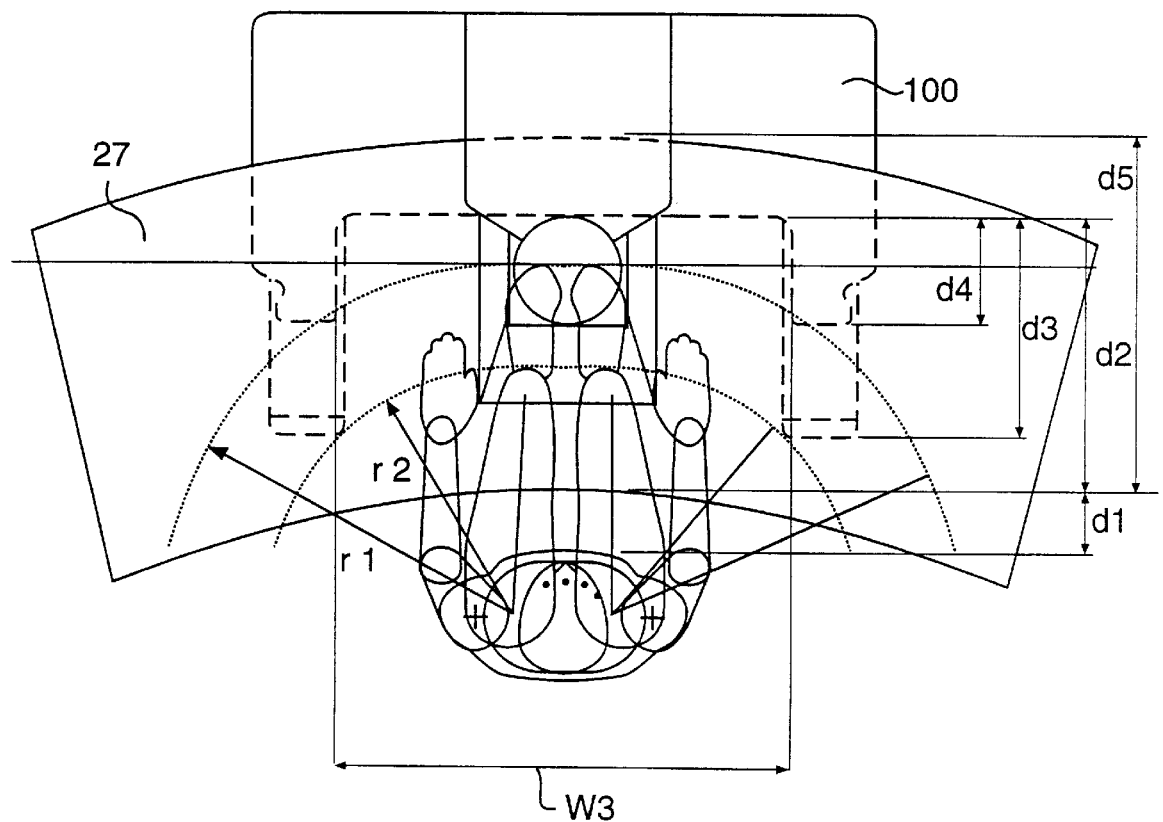
FIG. 7 is a schematic view showing the positional relation between the observer and the leg space.

FIG. 6 is a plan view showing the arrangement of the support structure 100 and the table 27. FIG. 7 shows the positional relationship between an observer and his leg space in relation to the components of the electron microscope. Now, the positional relation between the support structure 100 and the table 27 will be explained in the following.

The table 27 is supported on the top of the support structure 100 through the table supports 17a, 17b, as already described. It projects from the support structure 100 sideways and toward the observer, as shown in FIG. 6, so that the rear of the support structure 100 is partly exposed. That is, the back edge of the table 27 is not aligned with the back edge of the support structure 100.

The actual dimensions of the support structure 100 and the table 27 are set so that when an observer takes a natural working posture while sitting in a chair, there is sufficient leg space below the table 27. That is, as shown in FIG. 7, when an observer takes a natural observation posture, the dimension d1 from the front end of the table 27 on the observer's side to the front surface of the observer's body is 100 mm, and the front surface of the recess of the support structure 100 is 490 mm backward from the front end of the table 27. The dimension d4 of the projecting portions of the damper support 16 and the table supports 17a, 17b, described in FIG. 2, at the top left and top right of the support structure 100 is set to 189 mm and the dimension d3 of projecting portions of the legs 10a, 10b at the bottom left and bottom right of the support structure 100 is set to 399 mm, all according to a preferred embodiment.

These dimensions are determined from body dimensions of an observer of an average build according to known ergonomic data by taking the radius r1 of the necessary foot space about the body to be 620 mm and the radius r2 of the necessary knee space about the knees to be 440 mm.

Because of the above-mentioned positional relation between the support structure 100 and the table 27, it is possible to provide sufficient leg space below the table 27 which is larger than the leg space A described in FIG. 2 and which allows an observer, while looking into the microscope, to move sideways without hitting his or her knees against the support structure 100 and to turn his or her chair without any restrictions to leave the support structure 100.

Because the support structure 100 and the table 27 have the positional relationship mentioned above, it is possible to form a space between the underside of the table 27 and the support structure 100, in which the cut film desiccator 28 and the printed circuit board chamber 29 can be installed without obstructing the movement of the observer. The cut film desiccator 28 and the printed circuit board chamber 29 are supported on the support structure 100 and on the underside of the table 27.

Although this embodiment has shown the dimensions d1 to be 100 mm, d2 to be 490 mm, d3 to be 399 mm and d4 to be 189 mm, they are not limited to these. The leg space below the table 27 need only be set so that the foot space radius r1 falls in the range between 565 mm and 650 mm and that the knee space radius r2 falls in the range between 350 mm and 450 mm. Any setting within these ranges can provide the leg space equivalent to that of this embodiment described above.

Figure 8:
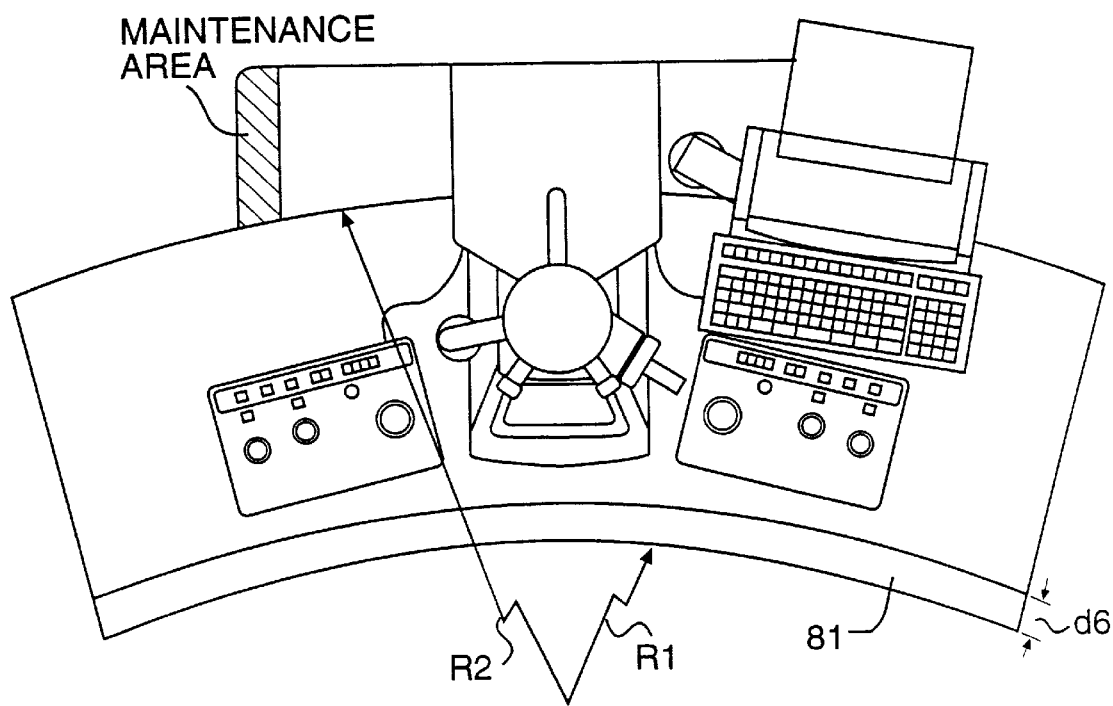
FIG. 8 is a top view showing the shape of the table.
Figure 9:
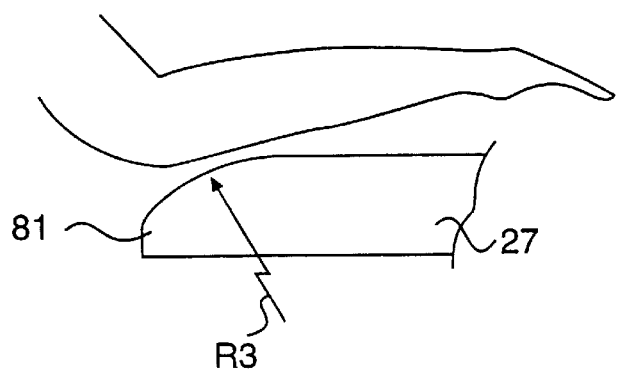
FIG. 9 is a schematic side view showing the end of the table on the observer's side.

FIG. 8 shows the shape of the table 27 and FIG. 9 shows the shape of the front edge of the table 27 on the observer's side. The detail of the shape of the table 27 is described by referring to FIG. 8 and 9.

The table 27, as shown in FIG. 8, is shaped so that the edge of the table on the observer's side and the opposite edge are formed from parts of concentric circles having their center at the observer. On the observer's side, the edge is curved in an arc having a radius R1 of 2000 mm and the rear edge is curved in an arc having a radius R2 of 2630 mm. Hence, the dimension of depth d5 is 630 mm (FIG. 7). The width dimensions of the table may be set to about 1600 mm on the front side and 1900 mm on the rear side. Further, as shown in FIG. 8, the table 27 is positioned forward of the back edge of the support structure to provide a maintenance area or access area for performing maintenance on the internal components of the electron microscope without removing the table.

As shown in FIG. 9, the table 27 has the front edge rounded downwardly in an arc having the radius R3 of 50 mm over a depth range d6 (FIG. 8) of 70 mm, measured from the front end on the observer's side toward the rear of the table. This rounded surface forms a place 81 for the observer to rest his or her elbows when he or she takes a natural observation posture.

Because the table 27 is curved as described above, the distance from the observer to the lateral ends of the table is shorter than when the table is formed rectangular. So, if an optional operation device is mounted at the farthest end of the table 27, the device can easily be reached and operated by the observer while sitting in a chair. Further, because the observer can rest his elbow on the smooth arc-shaped front end portion 81 of the upper surface of the table 27, the observer feels little pain in his elbow and can continue observation for long hours with less fatigue.

Figure 10:
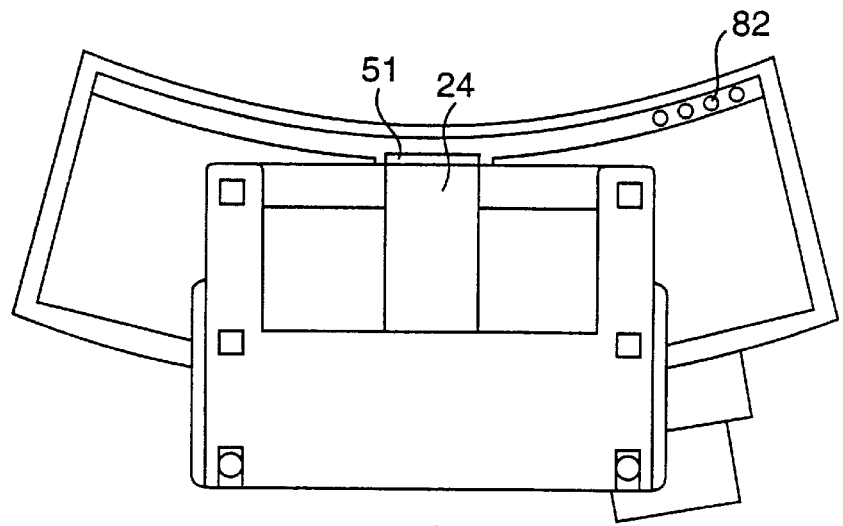
FIG. 10 is a bottom view showing the underside of the table 27.
Figure 11:
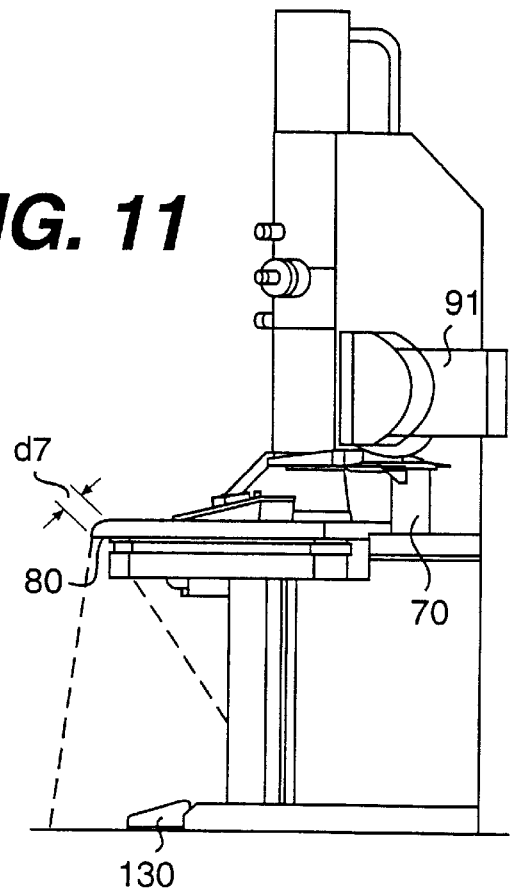
FIG. 11 is a side elevation showing how the leg space is illuminated.

FIG. 10 is a bottom view of the table 27 and FIG. 11 shows the condition of illumination. With reference to FIGS. 10 and 11, the illumination of observer's feet is explained. The electron microscope observation is normally performed by an observer looking into the viewing chamber 23, so the illumination of the room where the microscope is installed is usually at the minimum required. Hence, the embodiment of this invention provides enough lighting at the foot area so that the observer can move without difficulty.

The embodiment of this invention, as shown in FIG. 10, arranges a plurality of illuminating devices 82 along the front edge on the underside 80 of the table 27. These illuminating devices 82 are embedded in the underside 80 of the table 27 along the edge on the observer's side in the depth range d7 of 70 mm. These illuminating devices illuminate operation panels not shown located below the table 27 to facilitate their operation and also to offer an improved visibility of the lower part of the support structure, thereby preventing the observer from hitting his legs against the support structure. The cover surface 51 of the camera chamber 24 provided on the underside of the table is formed planar so that the entire camera cover surface 51 is illuminated by the illuminating devices 82. Thus, the observer can easily recognize the position of the camera chamber 24.

Figure 12:
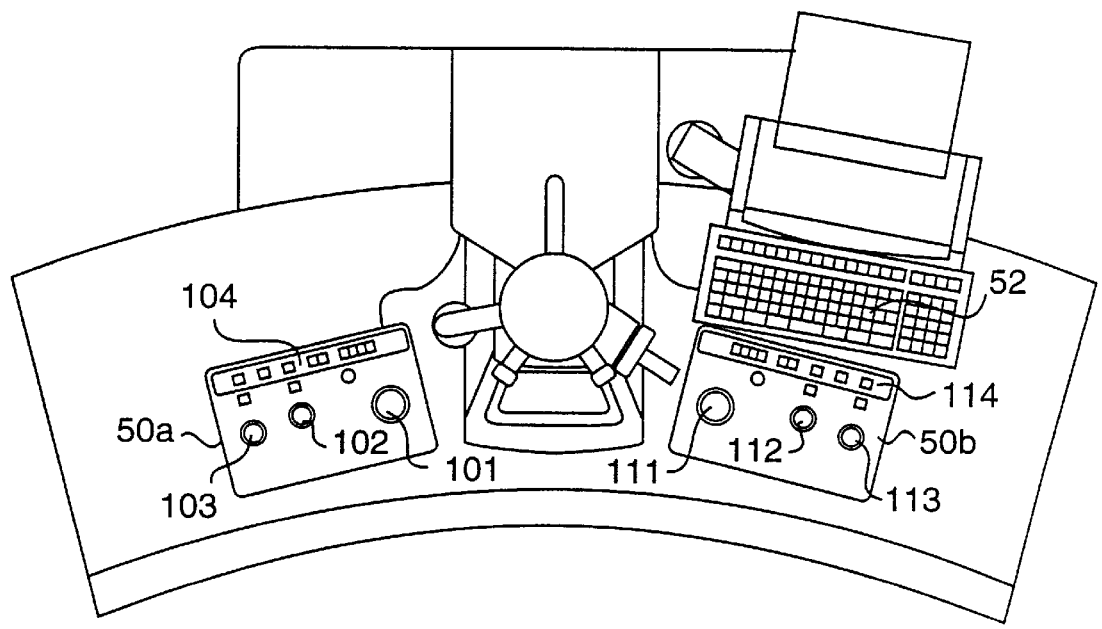
FIG. 12 is a plan view showing the arrangement of the operation panels on the table 27.

FIG. 12 is a plan view showing the arrangement of the operation panel on the table 27. The arrangement of the operation panel is explained below by referring to FIG. 12.

The operation panels 50a, 50b are movably mounted on the table 27 and are used to perform control and operation required for observation, such as moving of the X-Y stage of a specimen, focusing, brightness adjustment, magnification adjustment, beam correction and lens correction adjustment, photographing, and switching of conditions for beam correction and lens correction. Other operations are done by the keyboard 52.

The independently movable operation panels 50a, 50b on the table 27 have switches and dials used to perform minimum required operations during observation. These include, as shown, an X stage dial 101, a brightness adjust dial 102, a magnification adjust dial 103, a condition setting key switch 104, a Y stage dial 111, a focal distance adjust dial 112, an electron beam diffraction adjust dial 113, and a condition setting key switch 114.

These dials on the operation panel are arranged in the order of frequency of use from the viewing chamber 23 at the center toward outside, as will be explained in greater detail hereinafter with respect to further embodiments of the invention explained with reference to FIGS. 15–27. The condition setting switches 104 and 114 are located at the upper part of the operation panel. The dials are arranged on the table in an arc described by an arm pivoting about the elbow, which rests on the front side of the table.

With this arrangement, the observer can operate these dials by natural movement of hand without watching the operation panel. Further, because the operation panels 50a, 50b are completely independent of each other, as described above, they can be moved freely to any location on the table 27. That is, the observer can set the position of the operation panels 50a, 50b in such a way that the dials come within the reach of hand pivoting about the elbow. The observer can also take a desired posture for operation.

Figure 13:
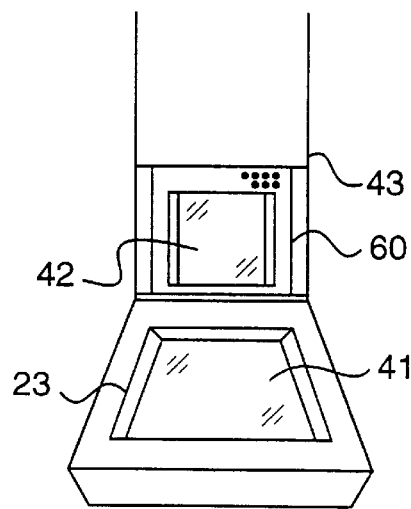
FIG. 13 is a front view showing the observation state indicator and the viewing chamber.
Figure 14:
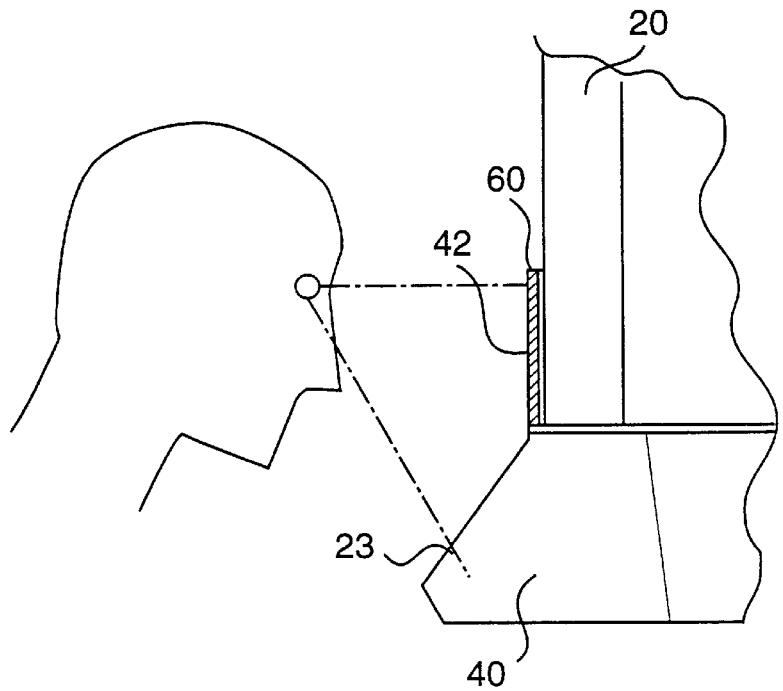
FIG. 14 is a schematic view showing the observer's line of sight when he or she looks at the observation state indicator and the viewing chamber.

FIG. 13 is a front view showing the observation state indicator and the viewing chamber. FIG. 14 shows the observer's line of sight upon the observation state indicator and the viewing chamber. With reference to FIG. 13 and 14, the observation state indicator 60 and the viewing chamber 23 provided in the electron gun column 20 will be explained.

As shown in FIG. 13, the observation state indicator 60 has a liquid crystal display panel 42 and a speaker 43. The liquid crystal display panel 42 displays information such as the condition of magnification required for observation, the vacuum level of the electron gun column 20, specimen chamber 22 and camera chamber 24, and mapping data. Other information is indicated on the display 61. The speaker 43 generates alarm sounds when equipment fails to alert the observer to the failure.

The viewing chamber 23 incorporates a phosphor plate 25, as shown in FIG. 3(a), to produce the image of a specimen, and the observer looks in through an embedded viewing glass 41 to see the specimen image formed inside. The viewing glass 41 is inclined so that the observer can easily see inside. The liquid crystal display panel 42 of the observation state indicator 60 is provided at the front of the electron gun column 20 so that it is in contact with the top of the viewing glass 41 and that it faces the observer. This liquid crystal display panel may be embedded in an opening formed in the electron gun column 20 or arranged so that its surface is partly exposed.

Because of this arrangement, the observer, as shown in FIG. 14, can see observation information displayed on the liquid crystal display panel 42, such as information directly required for observation and failure information, by moving only his line of sight without greatly changing the gazing posture that he is taking to perform what is considered the most important activity in the observation procedure, gazing into the viewing chamber 23. The observer therefore can sit in any desired posture in front of the equipment and perform operations on it. The observer also can maintain the gazing posture of looking into the viewing glass to read electronic information, the most important part of the observation procedure, and still glance at other information without greatly changing his attitude.

Although the above embodiment has been described to be applied to the transmission electron microscope, this invention can similarly be applied to a reflection electron microscope, too.

As described above, this invention offers a sufficient leg space for an observer sitting in a chair in a working posture, allows the observer to take any desired posture according to his or her physical build when performing operations, and enables concentrated observation and swift operations without entailing burdens on the observer. The invention therefore can realize a transmission electron microscope having an ergonomic working environment.

Figure 15:
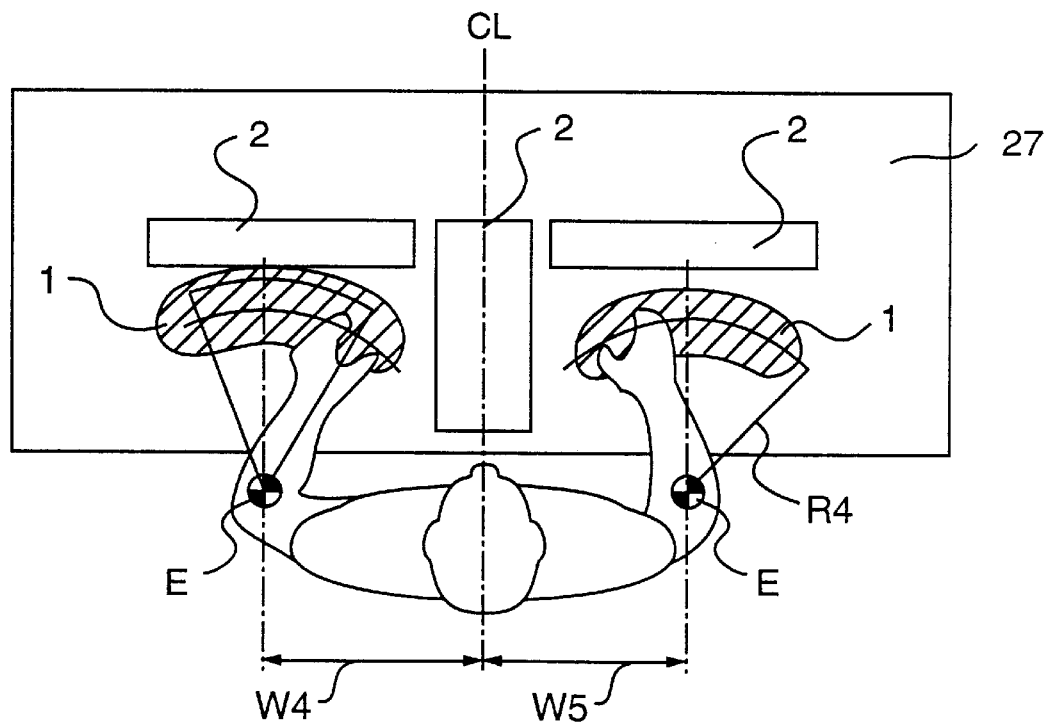
FIG. 15 is a schematic view showing a rough concept for determining the layout of the operation devices of the electron microscope of this invention according to a first embodiment of the invention.

FIG. 15 is a schematic diagram showing the layout of the operation devices according to a first embodiment of the invention. Typically, the operation devices of the electron microscope are classified into two groups: one including devices that are frequently operated during observation and the other including devices that are not frequently operated during operation but are mainly used before and after observation. These device groups are arranged in areas suited for their operations. In FIG. 15, the areas 1 identify where groups of the devices that are frequently used during observation are located. These areas are located on opposite sides of the center line CL of the operation table 27, which is shown in the figure as square shaped rather than curved as in the former embodiment. The areas 1 are each preferably disposed within a sector having two 450-mm sides R4 that are spread 30° toward the center line and 20° in the other direction from a point near the front edge of the table 300 mm away from the center line CL. The areas 2 identify areas in which groups of devices that are not frequently used during observation are located, which are areas preferably extending 500 mm rearward from the front edge of the operation table 450 mm to the left and the right of the center of the table, that is, these areas are located behind the areas 1, and also at the front center of the table or between the left and right areas 1.

The areas 1 where the group of devices that are frequently operated during observation are arranged almost matches the areas within reach of the operator's front arms pivoted about the elbows E when the operator rests his or her arms naturally on the operation table. Hence, by arranging the devices that are frequently operated during observation in these areas 1, the operator can guide his or her fingers over the devices as he or she pivots the front arms about the elbows, while keeping the upper part of the operator's body forwardly inclined with the front arms rested on the operation table so that the operator can easily keep a close look at the viewing area. This allows the operator to quickly feel for a desired device accurately for operation. The group of frequently used devices includes dials for moving the stages and adjusting focal distance, magnification power and brightness.

In the preceding paragraph, the operator's elbows were described to be located 300 mm to the left and right of the center of the operation table and the pivoting radii of the front arms to be about 450 mm. Generally, when persons about 155–185 cm tall are considered, it is appropriate to set the elbows at positions in a width range w4,w5 of 250–350 mm to the left and right of the center of the operation table, respectively, and the pivoting radii R4 of the front arms to be in the range 380–480 mm. As to the angle of an arc of the pivoting arms, because the human arms do not easily pivot outwardly, the arc angle on the outside (toward the outside edges of the table) cannot be set much greater than 20°. For the arc angle on the inside (toward the front edge of the table), however, it can be extended close to 90°. If too many devices are arranged on the pivoting radius area, it would be difficult to distinguish between them and there is a chance of fingers touching adjacent devices. Hence, it is appropriate to arrange three or four devices on each side.

The areas 2 where the group of devices not frequently used during observation, which include those for adjusting power supply, evacuation system, lenses and the electron gun, are arranged where they need not be felt by hand for operation. Rather, it is important to visually identify a desired device in these areas before manipulation to prevent erroneous operation. Hence, these devices are preferably arranged at positions where they can be easily recognized but not easily touched during the operation of the areas 1. They should nonetheless be within the reach of the operator's hands. The areas 2 for these devices, therefore, preferably are located behind the areas 1 or between the left and right areas 1.

Figure 16A:
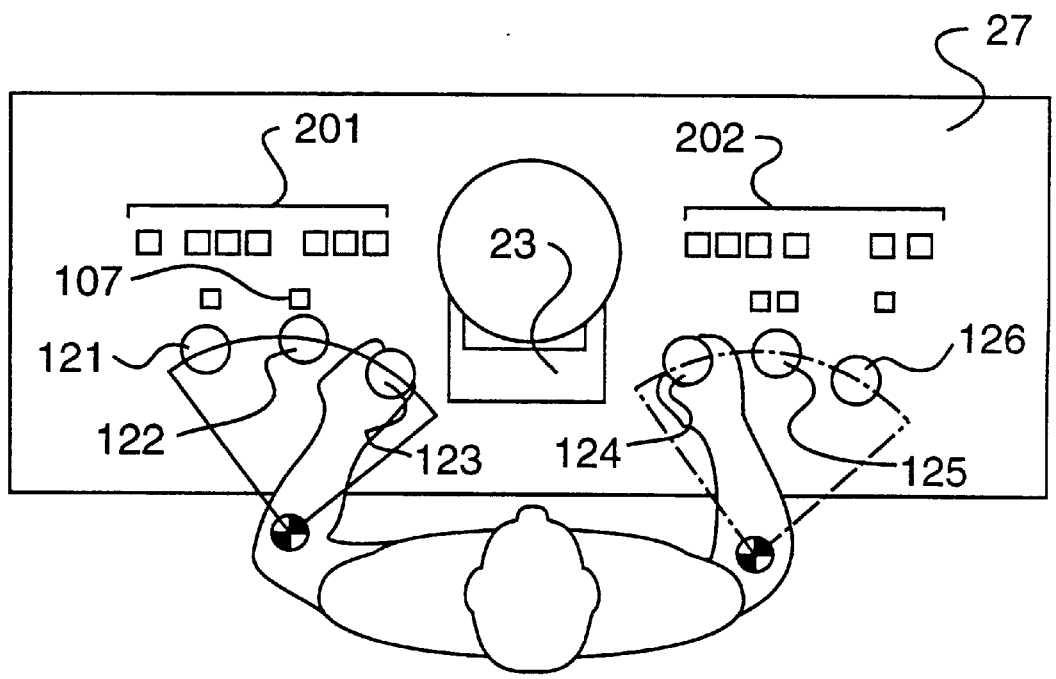
FIG. 16(a) is a plan view showing an example layout of the operation panel of the transmission electron microscope according to the first embodiment of the invention shown in FIG. 15.
Figure 16B:
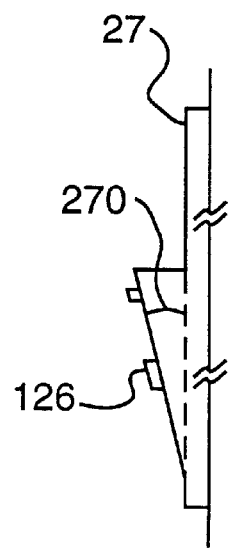
FIG. 16(b) is a partial side view of the operation panel as shown in FIG. 16(a).
Figure 17:
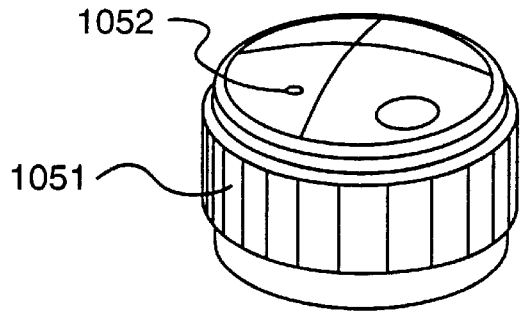
FIGS. 17(a)–17(c) are diagrams showing the details of a focal distance adjustment dial.
Figure 17:
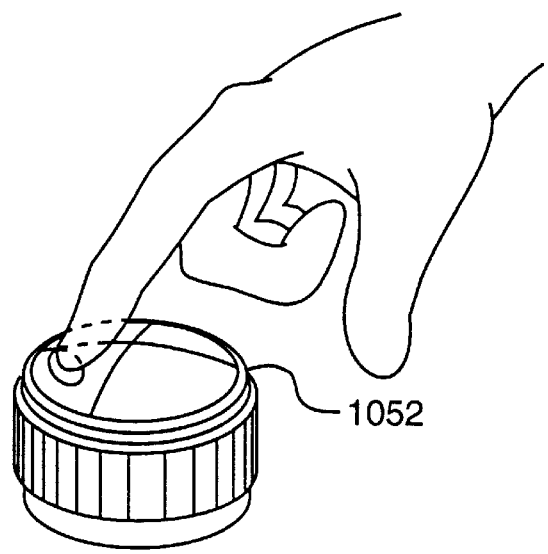
Figure 17:
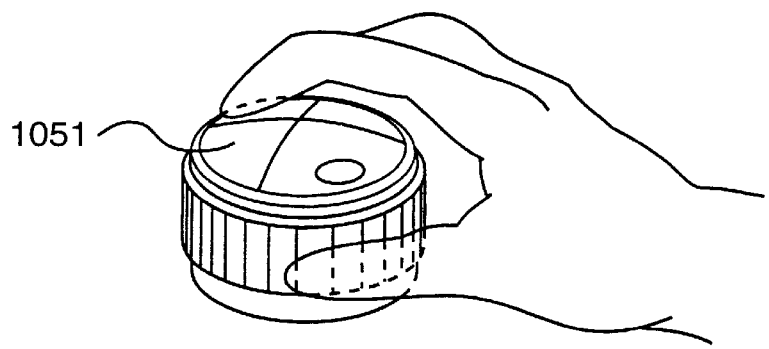
Figure 18:
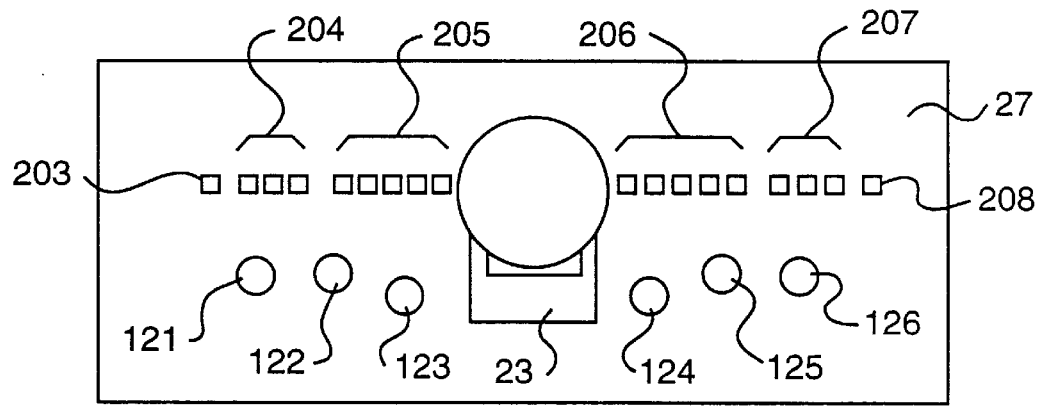
FIG. 18 is a schematic view showing the detailed layout of the devices that are not frequently used during observation.

FIG. 16 is a plan view showing an example layout of the operation devices on table 27 of a transmission electron microscope according to the first layout embodiment, and FIG. 17 illustrates the detail of adjusting the focal distance. FIG. 18 shows the detail of layout of the devices not frequently used during observation. In FIGS. 16 to 18, reference numerals 101–106 are adjustment dials, 201 and 202 are device groups not frequently used during observation, 107 is a coarse/fine selector switch, 1051 is a fine adjustment dial for focal distance, 1052 is a coarse adjustment dial for focal distance, and 203–208 are devices not frequently used during observation. In this embodiment of a transmission electron microscope, the observation chamber 23 is located at the center of the operation table. This configuration is based on the concept explained in FIG. 15.

As shown in FIG. 16, on the operation table 27, which optionally may be arranged on the operation panels 50a and 50b (not shown) the group of devices frequently operated during observation is arranged along the arc areas of the operator's pivoting front arms. That is, they are, from left center, an X-axis stage moving dial 123, a brightness adjust dial 122 and a magnification adjust dial 121, and, from right center, a Y-axis stage moving dial 124, a focal distance adjust dial 125 and an electron beam diffraction adjust dial 126. Behind these dials are arranged coarse/fine selector switches 107 as needed. The device groups 201, 202 that are not frequently used during observation are laid out in a single line behind the frequently used dials on the left and right side.

The stage moving dials 123, 124 are located on each side of the viewing chamber 23 in accordance with the conventional arrangement for a transmission electron microscope. Because the stage moving dials 123, 124 are arranged at the conventional positions, operators familiar with the operation of conventional equipment can easily adjust themselves to the device manipulation environment of the present invention, so that they can perform operations quickly.

The remaining dials are located on the outside of the stage moving dials along the arcs of the pivoting arms in the order of frequency of use. Such arrangements are effective in minimizing the amount of movement of the operator's arm during operation. Of the dials located equidistantly from the center, those that are considered to require finer adjustments are arranged on the right-hand side so that a right-handed person can easily manipulate them. The first embodiment of this invention, which is a transmission electron microscope, has the following dials arranged on the outside of the stage moving dials 123, 124: a focal distance adjust dial 125 to the right and a brightness adjust dial 122 to the left and also an electron beam diffraction adjust dial 106 further to the right of the dial 125 and a magnification adjust dial 121 further to the left of the dial 122. The arrangement of the stage moving dials 123, 124 is such that whichever of the dials for X- and Y-axis may be on the right-hand side, or their left and right positions may be switched according to preferences of the operator.

The devices belonging to respective dials, such as a coarse/fine selector switch 107 for the brightness adjust dial 122, are located close to the associated dial. This permits the operator to manipulate them without having to make a visual check.

With the device groups laid out as described above and as shown in FIG. 16(a), the operator can touch desired devices by pivoting his or her front arms about the elbows. This allows the operator to easily feel for a desired device and operate it while making observations. If, as shown in FIG. 16(b), the operation panel on which these devices are mounted is inclined by an angle 270 of 5–10° toward the operator, the operator's arms can be moved comfortably.

Next, by referring to FIG. 17, the focal distance adjust dial 125 will be explained in detail. The focal distance has a wide dynamic range and requires a delicate adjustment, so the conventional equipment has a range selector switch in addition to a coarse adjustment dial and a fine adjustment dial to provide a number of levels of revolution. The adjustment operation, however, is very troublesome.

To solve this problem, the first embodiment of this invention has the focal distance adjust dial 105 constructed as a double dial, as shown in FIG. 17(a), which consists of a fine adjust dial 1051 on the outside and a coarse adjust dial 1052 on the inner side, both rotated independently of each other. In making a coarse adjustment the operator puts his or her finger on the top of the coarse adjust dial 1052 and turns the dial, as shown in FIG. 17(b). For fine adjustment, the fine adjust dial 1051 is held with two or more fingers firmly and turned slowly for reliable adjustment, as shown in FIG. 17(c). That is, the double dial construction allows the fingers on each of the coarse and fine adjust dials to exhibit their motion capability to the full extent, making it possible to provide an appropriate adjustment without switching the range. The device of such a construction is applicable to equipment in general, in addition to electron microscopes, that have a wide dynamic range and require subtle adjustments.

Next, by referring to FIG. 18 the detailed layout of the devices that are not frequently used during observation will be described. In the first layout embodiment of this invention, the device groups 201, 202 that are not frequently used during observation are classified according to functions and arranged behind the arc regions of the natural pivoting movement of an observer's arms. These devices may be arranged in line from left to right, for example, as follows: a power switch 203, evacuation system devices 204, electron gun related devices 205, lens related devices 206, observation mode selection devices 207, and a photograph related device 208, the order of which may preferably match that of the operation procedure for ease of use. This also enables the operator to easily guess the position of a device he or she wants to reach for operation, reducing the operator's burden of having to visually identify the device. The adjustment of the electron gun related devices 205 and the lens related devices 206 often needs to be done while looking into the viewing area. In this case, it is advised that they be arranged at positions where they can be reached for operation by feel, as with the devices that are frequently used during observation.

Figure 19:
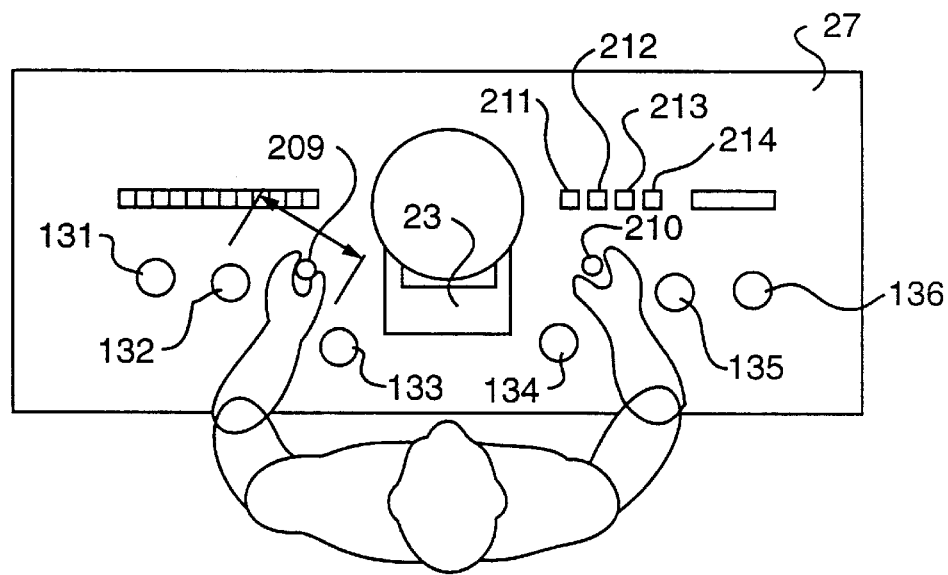
FIG. 19 is a plan view showing an example layout of the operation panel of the transmission electron microscope according to the second embodiment of this invention.

FIG. 19 is a plan view showing an example layout of the operation table of a transmission electron microscope according to the second layout embodiment of this invention. The second embodiment provides a layout of the operation table that enables the electron gun and lens adjustment devices to be reached for operation by feel. The configuration of the second embodiment will be described in the following.

The second embodiment of this invention shown in FIG. 19 is almost similar in layout to the first embodiment, except that the spaces between the left and right X- and Y-axis stage moving dials 133, 134 and the brightness and focal distance adjust dials 132, 135 are extended and that X- and Y-axis alignment adjust dials 209, 210 are arranged behind these spaces. The alignment adjust dials 209, 210 are used to make adjustment and correction in a variety of alignments for selected ones of alignment selection buttons arranged behind the alignment adjust dials 209, 210, such as a beam horizontal axis adjust button 211, a beam inclined axis adjust button 212, a light emitting lens astigmatism correction button 213 and an object lens astigmatism correction button 214, among others not described.

In the second embodiment, once a necessary function is selected from the alignment selection buttons 211–214, the operator can make a variety of alignment adjustments by reaching the alignment adjust dial 209, 210 by touch while looking into the observation area. Because the space between the X-axis stage moving dial 133 and the brightness adjust dial 132 and the space between the Y-axis stage moving dial 134 and the focal distance adjust dial 135 are wide, the operator can manipulate the alignment adjust dials without touching other devices.

Figure 20:
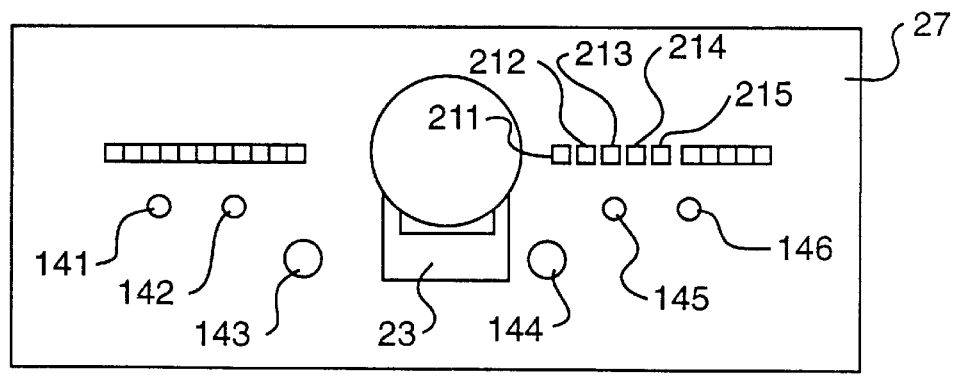
FIG. 20 is a plan view showing an example layout of the operation panel of the transmission electron microscope according to the third embodiment of this invention.

FIG. 20 is a plan view showing an example layout of the operation table of a transmission electron microscope according to the third layout embodiment of this invention. The third embodiment provides another layout of operation table that enables the electron gun and lens adjustment devices to be reached for operation by feel. The configuration of the third embodiment will be described in the following. In the third embodiment shown in FIG. 20, the X- and Y-axis stage moving dials 143, 144 on the left and right are made to serve also as the X- and Y-axis alignment adjust dials. Behind the stage moving dials are arranged a stage movement selection button 215 and alignment selection buttons such as a beam horizontal axis adjust button 211, a beam inclined axis adjust button 212, a light emitting lens astigmatism correction button 213 and an object lens astigmatism correction button 214.

With the stage movement selection button 215 selected, the X- and Y-axis stage moving dials 143, 144 on the left and right can normally perform the stage moving function. When one of the alignment selection buttons 211-214 representing a desired function is selected, the X- and Y-axis stage moving dials 143, 144 on the left and right can perform adjustment and correction in a variety of alignments corresponding to the selected button.

Hence, in this third embodiment, once a desired function is chosen from the alignment selection buttons 211–214, the operator then can make adjustment on the selected function by feeling for the stage moving dials 143, 144 and operating them while looking into the observation area. Adjustment dials 141, 142 and 145 and 146 are arranged outside of dials 143 and 144, as shown.

Figure 21:
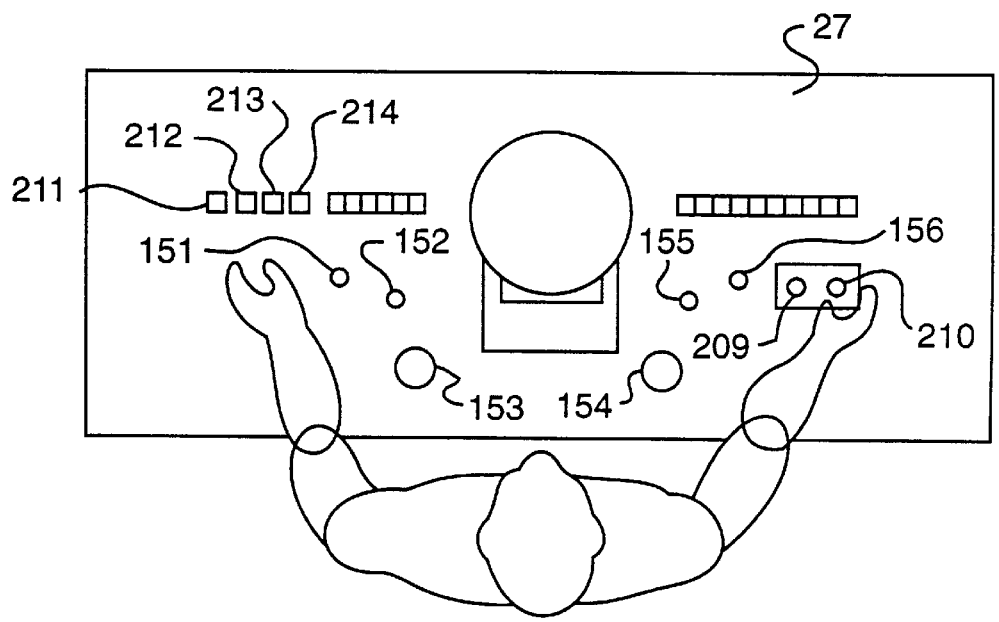
FIG. 21 is a plan view showing an example layout of the operation panel of the transmission electron microscope according to the fourth embodiment of this invention.

FIG. 21 is a plan view showing an example layout of the operation table of a transmission electron microscope according to the fourth layout embodiment of this invention. The fourth embodiment provides still another layout of operation table that enables the electron gun and lens adjustment devices to be reached for operation by feel. The configuration of the fourth embodiment will be described in the following. In the fourth embodiment shown in FIG. 21, the X- and Y-axis alignment adjust dials 209, 210 are arranged at the right-hand end of the operation table, and alignment selection buttons such as a beam horizontal axis adjust button 211, a beam inclined axis adjust button 212, a light emitting lens astigmatism correction button 213 and an object lens astigmatism correction button 214 are located at the left end. The adjustment dials 151–156, which have the corresponding functions as dials 121–126, respectively, are arranged as shown in the figure.

With this arrangement, the operator, after selecting a desired function from the alignment selection buttons 211–214 with a left hand, can manipulate the alignment adjust dials 209, 210 with a right hand to adjust the selected one of alignments while looking into the observation area. Such an arrangement is advantageous when a plurality of alignments are adjusted at the same time.

In the preceding embodiments, when the devices are arranged on the arc areas within reach of the operator's pivoting arms, they need to be located at convenient positions for any operator. If these devices are arranged on operation panels, which are made movable forward and backward on the operation table 27 or made rotatable, the freedom of the devices can further be increased and their ease of use ensured for operators having a wide range of mobility due to their unique physical attributes..

Figure 22:
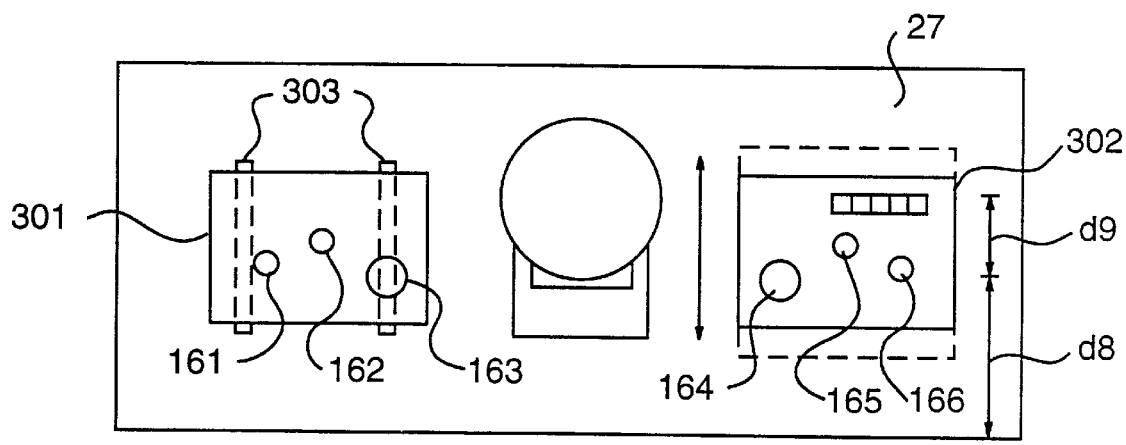
FIG. 22 is a plan view showing an example layout of the operation panel of the transmission electron microscope according to the fifth embodiment of this invention.

FIG. 22 is a plan view showing an example layout of the operation table of a transmission electron microscope according to the fifth embodiment of this invention. The fifth embodiment arranges the dials and switches of the first embodiment on the left and right operation panels and provides a parallel movement mechanism that enables these panels to be moved in parallel on the operation table. The adjustment dials 161–166, which have the corresponding functions as dials 121–126, respectively, are arranged as shown in the figure on operation panels 301, 302. the operation panels 301, 302 are placed on the left and right side of the operation table and are each provided on their underside with rails 303 to allow their longitudinal motion on the operation table. As a result, the operator can move the operation panels 301, 302 to a desired positions where he or she can use them in a suitable condition. In this case, the operation panels 301, 302 should preferably be constructed so that the stage moving dials 163, 164 can be moved in a range d8 to about 280 mm from the edge of the operation table or back and forth with respect to a centered position over a depth range d9 of about 140 mm, as shown.

Figure 23:
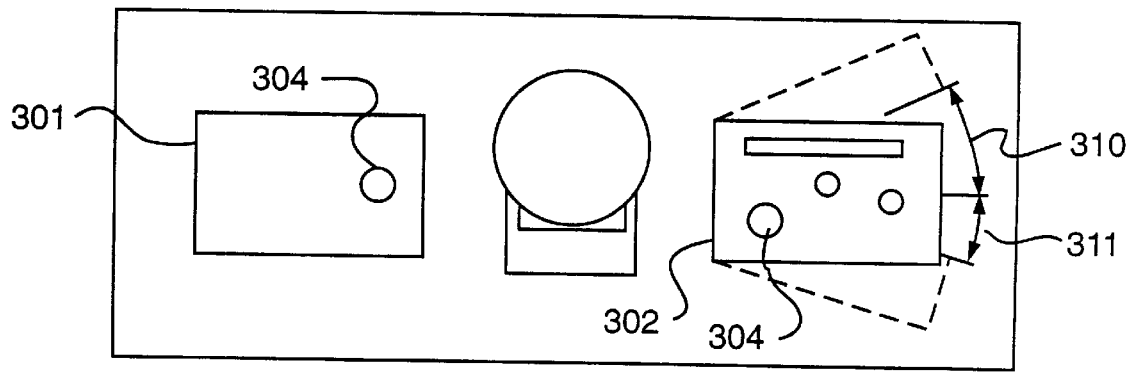
FIG. 23 is a plan view showing an example layout of the operation panel of the transmission electron microscope according to the sixth embodiment of this invention.

FIG. 23 is a plan view showing an example layout of the operation table of a transmission electron microscope according to the sixth embodiment of this invention. The sixth embodiment arranges the dials and switches of the first embodiment on the left and right operation panels and provides a rotating mechanism that enables these panels to be rotated on the operation table.

In the sixth embodiment, operation panels 301, 302 are arranged on the left and right side of the operation table and are each provided with rotation shafts 304 (pivot mounts) under stage moving dials (not shown), but that are mounted on the operation panels 301, 302 to allow the panels to be rotated on the operation table. As a result, the operator can rotate the operation panels 301, 302 to a desired direction suited for his or her requirements. In this case, the operation panels 301, 302 should preferably be constructed so that they can be rotated about the stage moving dials in an arc 310 over a range of approximately 25° inward and in an arc 311 over a range of about 15° outward.

Figure 24:
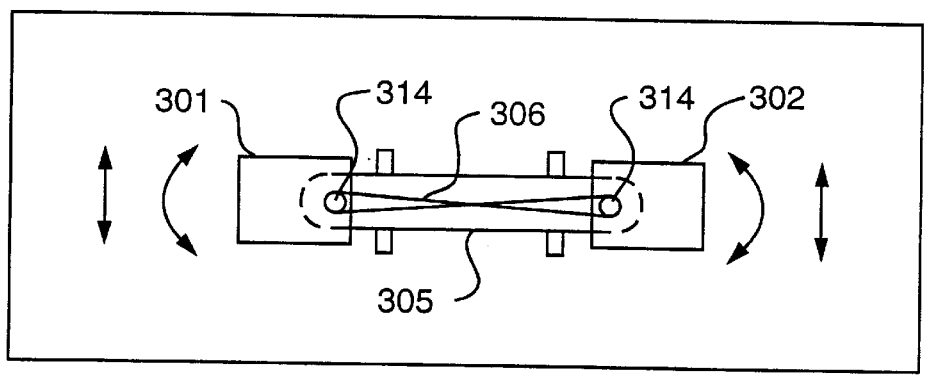
FIG. 24 is a plan view showing an example layout of the operation panel of the transmission electron microscope according to the seventh embodiment of this invention.

FIG. 24 is a plan view showing an example layout of the operation table of a transmission electron microscope according to the seventh embodiment of this invention. The seventh embodiment arranges the dials and switches of the first embodiment on the left and right operation panels and provides a mechanism that enables these panels to be moved in parallel and rotated on the operation table.

In the seventh embodiment, operation panels 301, 302 are arranged on the left and right side of the operation table and are each provided with a parallel moving mechanism and a rotating mechanism. They are so constructed that moving one of the operation panels causes the other to follow the motion of the first. In this embodiment, the operation panels 301, 302 are connected to the parallel moving block 305 that moves longitudinally under the operation table on which the operation panels 301, 302 are mounted. This construction allows the left and right operation panels 301, 302 to be moved in parallel at the same time. The operations panels 301, 302 are also connected to the parallel moving block 305 by rotating shafts 314, which are connected with each other with a belt 306 that is reversely wound around the shafts like a letter 8. This arrangement causes the left and right operation panels 301, 302 to rotate symmetrically in the opposite directions.

In the seventh embodiment described above, the operator first moves the operation panels 301, 302 in parallel so that the stage moving dials (not shown) are positioned as desired, and then rotates the operation panels 301, 302 so that all the dials are within arc areas within reach of the operator's pivoting arms. This setting puts the devices in a layout that allows them to be used with the greatest ease. The similar result can also be obtained if the operation panels 301, 302 mounted with the devices are put on the operation table as independent components.

Figure 25:
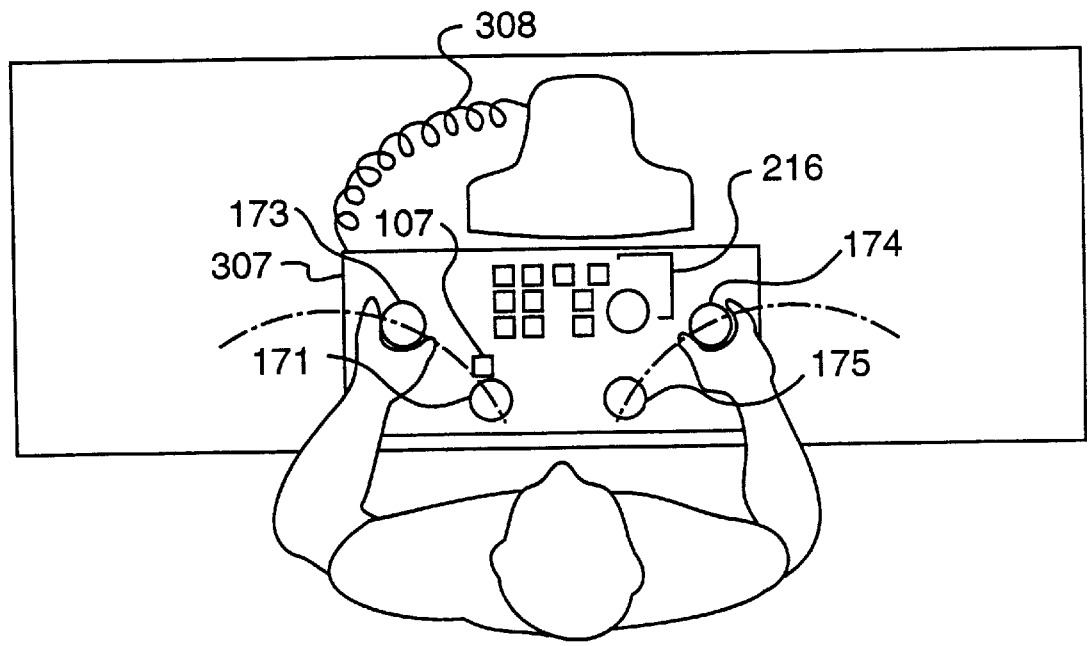
FIGS. 25(a) and 25(b) are plan views showing an example layout of the operation panel of the transmission electron microscope according to the eighth embodiment of this invention.
Figure 25:
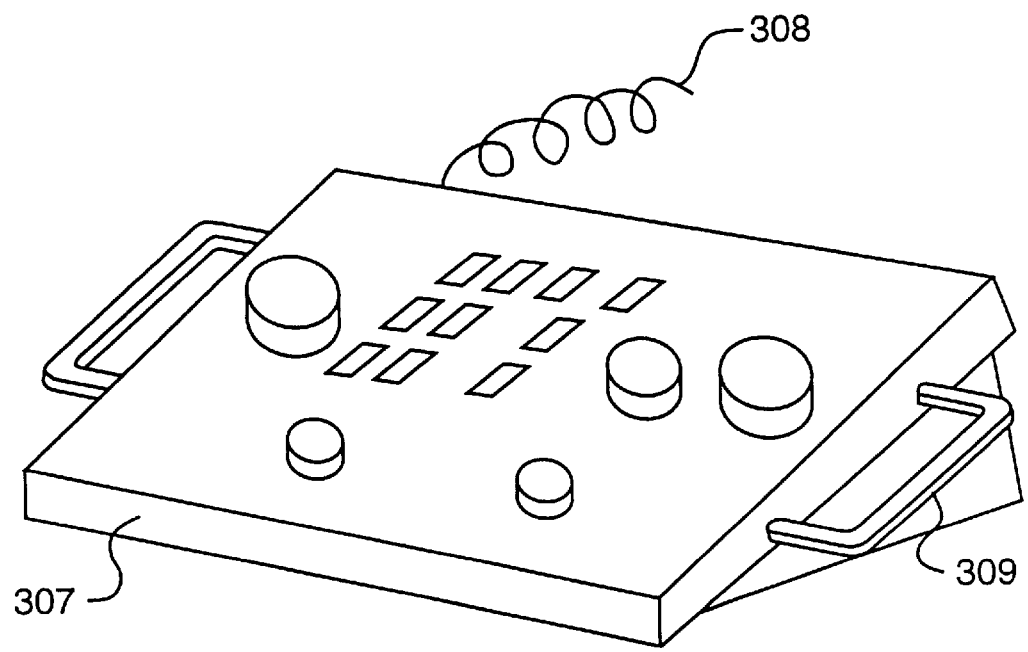

FIGS. 25(*a*) and 25(*b*) are plan views showing an example layout of the operation table of an electron microscope according to the eighth embodiment of this invention. In the eighth embodiment, observation is performed through a monitor as in the scanning electron microscope and the observation area is arranged above the operation table.

In the eighth embodiment, as shown in FIG. 25(*a*), an independent operation panel 307 on which all the devices are arranged is movably mounted on the operation table. In the arc areas on the operation panel 307 covered by the operator's pivoting arms are arranged, from left to right, an X-axis stage moving dial 173, a magnification adjustment dial 171, a focal distance adjust dial 175 and a Y-axis stage moving dial 174. Behind these dials is arranged a coarse/fine selector switch 107 as needed. The devices 216 that are not frequently used during observation are located at the central portion of the operation panel 307.

In the eighth embodiment described above, because the observation area is not located on the operation table as it is with the transmission electron microscope, it is possible to arrange the devices also in front of the operator so that a short-statured person can easily reach them. In the eighth embodiment, the operator first places the stage moving dials 173, 174 at positions where he or she rests the front arms naturally on the operation table, i.e., on the extension lines of the front arms, and then arranges on the central side of the arc areas covered by the pivoting arms the devices that are second most frequently used during observation and which in the case of a scanning electron microscope are, from right to left, a focal distance adjust dial 175 and a magnification adjust dial 171.

The devices 216 that are not frequently used are classified according to functions and are all arranged in one group at the central part of the panel on the operation table. The operator therefore can take a full view of all of the devices simply by turning his or her eyes slightly down from the monitor, and the devices can be operated either by left or right hand equally.

As shown in FIG. 25(*b*), the operation panel 307 is electrically connected through a cable 308 to the operation table or, if the cable on the table is a nuisance, it may be connected wireless as by infrared optical coupling. The operation panel 307 is provided with grips 309 on the sides for easy transport.

FIG. 26 is a plan view showing an example layout of the operation table of an electron microscope according to the ninth embodiment of this invention. FIGS. 27(*a*) and 27(*b*) show the postures of an operator when he is making observations and when he is making keyboard inputs. This embodiment shows the use of the keyboard set forth in the preceding eighth embodiment. In the ninth embodiment, the keyboard 501 is stowed away under the operation table. For use, the keyboard 501 is drawn out forward and placed on the front center of the operation table.

Generally, the operator during observation should take a posture in which, as shown in FIG. 27(*a*), the upper part of this body is forwardly inclined to look into the observation area, with his elbows resting on the table to stabilize his head. When making keyboard inputs as usually done to computers, an operational posture is preferred in which, as shown in FIG. 27(*b*), the operator is somewhat away from the monitor so that he can see the entire screen. The arrangement of the ninth embodiment described above has been determined from this standpoint. In either type of work, the operation can be performed with ease. That is, when the keyboard 501 is located at the front, the operator necessarily pulls his upper body backward to secure a posture that allows easy operation, leading to the operational posture described above.

As described above, because the operation panel is laid out in conformity with the work environment of the operator so that the devices of the electron microscope can be operated easily by the operator who is also an observer, it is possible to give each operation device an appropriate operability according to its use and thereby improve the operability of the electron microscope.

We claim:

1. An electron microscope comprising:
   an observation chamber;
   an operation table; and
   said operation table having an operation section having operation devices for performing operations required to make observations;
   wherein the operation devices include a group of devices that are operated while looking into a viewing area of said observation chamber, wherein the group of devices that are operated during the looking are arranged in areas disposed within sectors on the operation table;
   wherein each of said sectors is bounded by radii in a range of 380 mm to 480 mm, each of said radii has an origin at a corresponding point near a front edge of the operation table that is 250 mm to 350 mm to either side of a center line, respectively, that passes through said observation chamber, and wherein said sectors have respective adjacent sides that are spread up to 30° in a direction toward the center line and respective opposite sides that are spread up to 20° away from said centerline, with respect to said origin; and
   further wherein at least three adjacent ones of the group of devices in at least one of said sectors are arranged along a concave shaped curve within said at least one sector.

2. An electron microscope according to claim 1, wherein ones of the devices that are operated while looking into the viewing area and that require coarse and fine adjustments are formed as double rotary dials, including a fine adjust dial on an outer side and a coarse adjust dial on an inner side, both said dials being rotatable independently of each other.

3. An electron microscope according to claim 1, further including secondary devices required for operating the operation devices that are operated during the looking into the viewing area being arranged around the corresponding operation devices.

4. An electron microscope according to claim 1, further including another group of devices that are used before and after the looking are classified according to functions and are arranged in areas that are, when viewed from an operator's position, behind areas within reach of an operator's hands when pivoting the forearms and which are easily recognized visually.

5. An electron microscope according to claim 4, wherein the group of devices that are used before and after the looking are arranged, from left to right, in conformity with predetermined operations performed by the devices.

6. An electron microscope according to claim 4, wherein the group of devices that are used before and after the looking are arranged in one group at the central part of the operation table.

7. An electron microscope according to claim 1, wherein the devices that are operated during the looking are arranged on an operation panel, and the operation panel is set slightly inclined toward the operator.

8. An electron microscope according to claim 7, further comprising a mechanism that enables the operation panel to be moved back and forth.

9. An electron microscope according to claim 7, further comprising a mechanism that enables the operation panel to be rotated.

10. An electron microscope according to claim 7, wherein the operation panel is independent of the operation table.

11. An electron microscope according to claim 1, wherein a keyboard is arranged at the front center of the operation panel.

12. An electron microscope according to claim 11, wherein the operation table has a drawer and wherein the keyboard is accommodated in said drawer.

13. An electron microscope according to claim 1, wherein said concave shaped curve along which said at least three adjacent ones of the group of devices are arranged is an arc having a radius extending from said origin at said corresponding point near a front edge of the operation table.

14. An electron microscope comprising:

a viewing area to look at an observation image;

an operation table; and an operation section on said operation table having operation devices for performing operations required to make observations;

said operation devices including a plurality of devices that are operated while looking into said viewing area, and said devices operated during looking into the viewing area are arranged within sector shaped areas, respectively; and at least three adjacent ones of said plurality of devices in at least one of said sector shaped areas are arranged along a concave shaped curve within said at least one sector shaped area.

15. An electron microscope according to claim 14, wherein said devices operated during the looking include at least a magnification adjustment device.

16. An electron microscope according to claim 14, wherein said devices operated during the looking are arranged on said operation table.

17. An electron microscope according to claim 14, further including an operation panel separate from said operation table, wherein said devices operated during the looking are arranged on said operation panel.

18. An electron microscope according to claim 14, further including an operation panel separate from said operation table and having parts to be arranged to each of opposite sides of said viewing area, wherein said devices operated during the looking are respectively arranged on said parts of said operation panel.

19. An electron microscope according to claim 14, further including secondary devices required for operating the devices operated during the looking, said secondary devices being arranged around corresponding ones of the devices operated during looking.

20. An electron microscope according to claim 14, further including coarse-fine selector switches for said devices operated during the looking that are arranged behind said devices with respect to an operator.

21. An electron microscope according to claim 14, further including a group of devices that are used before and after the looking and not during looking that are arranged in areas, when viewed from an operator's position, that are behind areas within reach of an operator's pivoting forearms.

22. An electron microscope according to claim 21, further including an operation panel separate from said operation table, wherein said devices operated during the looking and said devices of said group are arranged on said operation panel.

23. An electron microscope according to claim 22, wherein said operation panel has two parts separate from one another, wherein said devices operated during the looking and said devices of said group are correspondingly arranged on said separate parts of said operation panel.

24. An electron microscope according to claim 21, wherein the group of devices that are used before and after the looking devices are arranged, from left to right, in conformity with predetermined operations performed by the devices of the group.

25. An electron microscope according to claim 14, wherein said viewing area is arranged in central area abreast with said devices on said table, the devices operated during the looking are arranged such that a stage moving dial is located at a position that is most naturally reached by the operator and that others of said devices are successively arranged outside of the stage moving dial toward side edges of the operation table in an order of frequency of use.

26. An electron microscope comprising:

a viewing area to look at an observation image;

an operation table; and an operation section on said operation table having operation devices for performing operations required to make observations;

said operation devices including a plurality of devices that are operated while looking into said viewing area and said operation devices being arranged along a concave shaped curve within at least one sector shaped area;

wherein ones of the devices operated during the looking that require coarse and fine adjustments are formed as double rotary dials, including a fine adjust dial on an outer side and a coarse adjust dial on an inner side, both said dials being rotatable independently of each other.

27. An electron microscope according to claim 14, wherein the devices operated during the looking are arranged on an operation panel, and the operation panel is inclined toward the operator.

28. An electron microscope comprising:

an observation chamber;

an operation table; and an operation section on said operation table having operation devices for performing operations required to make observations;

said operation devices including a plurality of devices that are operated while looking into a viewing area of said observation chamber, and at least three of said devices operated during looking into the viewing area are arranged along a concave shaped curve within a sector shaped area.

29. An electron microscope comprising:

a viewing area to look at an observation image;

an operation table; and an operation section on said operation table having operation devices for performing operations required to make observations;

said operation devices including a plurality of devices that are operated while looking into said viewing area, and said devices operated during looking into the viewing area are arranged along concave shaped curves within sector shaped areas, respectively; and wherein said viewing area is arranged in a rear area of said devices on said table, the devices operated during the looking are arranged such that a stage moving dial is located at a position that is most naturally reached by the operator and that others of said devices are successively arranged inside of the stage moving dial toward a center of the operation table in an order of frequency of use.

* * * * *